US012775348B2

(12) United States Patent
Kim

(10) Patent No.: US 12,775,348 B2
(45) Date of Patent: Oct. 27, 2026

(54) DISPLAY APPARATUS

(71) Applicant: LG Display Co., Ltd., Seoul (KR)

(72) Inventor: Sangjin Kim, Busan (KR)

(73) Assignee: LG DISPLAY CO., LTD., Seoul (KR)

( * ) Notice: Subject to any disclaimer, the term of this patent is extended or adjusted under 35 U.S.C. 154(b) by 327 days.

(21) Appl. No.: 18/514,851

(22) Filed: Nov. 20, 2023

(65) Prior Publication Data

US 2024/0168581 A1 May 23, 2024

(30) Foreign Application Priority Data

Nov. 21, 2022 (KR) ........................ 10-2022-0156204

(51) Int. Cl.

| | |
|---|---|
| ***G06F 3/041*** | (2006.01) |
| ***G06F 3/044*** | (2006.01) |
| ***G09G 3/3225*** | (2016.01) |
| ***H10K 59/124*** | (2023.01) |
| ***H10K 59/40*** | (2023.01) |
| ***H10K 59/80*** | (2023.01) |

(52) U.S. Cl.

CPC ........ *G06F 3/0412* (2013.01); *G06F 3/04164* (2019.05); *G06F 3/0446* (2019.05); *G09G 3/3225* (2013.01); *H10K 59/124* (2023.02); *H10K 59/40* (2023.02); *H10K 59/873* (2023.02); *G09G 2300/0842* (2013.01)

(58) Field of Classification Search

CPC ... G06F 3/0446; G06F 3/04164; G06F 3/0412

See application file for complete search history.

(56) References Cited

U.S. PATENT DOCUMENTS 8,441,181 B2 * 5/2013 Kim .................. H10K 59/1275 313/506
11,610,955 B2 * 3/2023 Kim .................... H10K 59/124
2007/0132365 A1 * 6/2007 Kang .................. H10D 86/441 257/E29.147
2018/0033849 A1 2/2018 Noh et al.

(Continued)

FOREIGN PATENT DOCUMENTS

KR 10-2018-0012442 A 2/2018
KR 10-2019-0075653 A 7/2019

(Continued)

*Primary Examiner* — Dale E Page
*Assistant Examiner* — Wilner Jean Baptiste
(74) *Attorney, Agent, or Firm* — Birch, Stewart, Kolasch & Birch, LLP

(57) ABSTRACT

A display apparatus according to an example of the present disclosure includes a substrate having an active area and a non-active area having a pad unit, a thin film transistor disposed in the active area, a light emitting diode disposed in the active area and connected to the thin film transistor, an encapsulation layer covering the thin film transistor and the light emitting diode, a touch electrode array disposed in the active area on the encapsulation film, a first touch pad electrode disposed in a pad unit of the substrate and connected to the touch electrode array through a touch link line, and a planarization film patterned in the pad unit in an island shape to cover a part of the first touch pad electrode. Based on this configuration, the electrolytic corrosion of the chip on film (COF) due to film lifting can be suppressed or minimized effectively.

20 Claims, 13 Drawing Sheets

(56) References Cited

U.S. PATENT DOCUMENTS

| | | | |
|---|---|---|---|
| 2019/0326360 A1 | 10/2019 | Gwon et al. | |
| 2020/0152708 A1 | 5/2020 | Kim et al. | |
| 2022/0206618 A1* | 6/2022 | Lee | G06F 3/0412 |

FOREIGN PATENT DOCUMENTS

| | | |
|---|---|---|
| KR | 10-2019-0121533 A | 10/2019 |
| KR | 10-2020-0055992 A | 5/2020 |
| KR | 10-2020-0061056 A | 6/2020 |
| KR | 10-2021-0057440 A | 5/2021 |

* cited by examiner

DISPLAY APPARATUS

CROSS-REFERENCE TO RELATED APPLICATIONS

This application claims priority to Korean Patent Application No. 10-2022-0156204 filed on Nov. 21, 2022, in the Korean Intellectual Property Office, the disclosure of which is hereby expressly incorporated by reference into the present application.

BACKGROUND

Field

The present disclosure relates to a display apparatus with reduced electrolytic corrosion defect.

Discussion of the Related Art

Recently, as the society enters a full-scale information era, the field of a display apparatus which processes and displays a large number of information and contents has been rapidly developed. Among the display apparatuses which are used for a monitor of a computer, a television, or a cellular phone, there exist an organic light emitting display (OLED) apparatus which is a self-emitting device and a liquid crystal display (LCD) apparatus which needs a separate light source.

An applicable range of the display apparatus is diversified to cover various fields and application, including personal digital assistants or vehicles as well as monitors of computers and televisions. As a result, a display apparatus with a large display area and a reduced volume and weight is being studied.

In order to provide various functions to users, a display apparatus provides a function of recognizing a touch by a finger or a pen of a user which is in contact with a display panel and a function of performing input processing based on the recognized touch.

The display apparatus can include a plurality of touch electrodes disposed above the display panel or embedded in the display panel. Further, the display apparatus can detect a change in the capacitance generated by the user's touch to sense the user's touch on the display panel.

SUMMARY OF THE DISCLOSURE

In a pad unit in which a touch pad of a display apparatus is bonded in a chip on film (COF) manner, a touch panel is provided on an encapsulation layer. In such a case, however, film stress on a planarization film covering a first touch pad electrode can be increased due to a touch buffer film or a touch insulating film of the touch panel. Accordingly, film lifting of the touch insulating film can occur. In this case, moisture can permeate through the lifted film in a high temperature and high humidity environment so that an electrolytic corrosion defect issue where the electrode of the COF is corroded can occur.

Accordingly, the inventor of the present disclosure has recognized the above-mentioned problems and issues, and has solved or addressed an interfacial adhesion issue between a touch buffer film or a touch insulating film and the planarization film, by inventing a new display apparatus which minimizes the film lifting of the planarization film to suppress the COF electrolytic corrosion defect/issue.

An object to be achieved by the present disclosure is to provide a display apparatus which can suppress the electrolytic corrosion defect of the COF.

Objects of the present disclosure are not limited to the above-mentioned objects, and other objects, which are not mentioned above, can be clearly understood by those skilled in the art from the following descriptions.

According to an aspect of the present disclosure, a display apparatus can include a substrate including an active area and a non-active area including a pad unit, a plurality of thin film transistors disposed in the active area, a light emitting diode which is disposed in the active area and is connected to the thin film transistor, an encapsulation layer which covers the thin film transistor and the light emitting diode, a touch electrode array disposed in the active area above the encapsulation layer, a first touch pad electrode which is disposed in the pad unit of the substrate and is connected to the touch electrode array through a touch link line and a planarization film which is patterned in the pad unit in an island shape to cover a part of the first touch pad electrode.

According to another aspect of the present disclosure, a display apparatus can include a substrate including an active area and a non-active area including a pad unit, a plurality of thin film transistors disposed in the active area, a light emitting diode which is disposed in the active area and is connected to the thin film transistor, an encapsulation layer which covers the thin film transistor and the light emitting diode, a touch electrode array disposed in the active area above the encapsulation layer, a touch pad electrode which is disposed in the pad unit of the substrate and is connected to the touch electrode array, a planarization film which is patterned in the pad unit in an island shape to cover a part of the touch pad electrode, a touch buffer film which is disposed above the encapsulation layer and is removed from the pad unit to be spaced apart from one end of the planarization film patterned in the pad unit in an island shape, to be open and a touch insulating film which is disposed on a touch link line and is removed from the pad unit to be spaced apart from one end of the planarization film patterned in the pad unit in an island shape with a predetermined distance, to be open.

Other detailed matters of the exemplary embodiments are included in the detailed description and the drawings.

According to an exemplary embodiment of the present disclosure, in a pad unit in which the touch pad is bonded in a COF manner, the touch buffer film and the touch insulating film are removed to partially expose the touch link line and a connection pad electrode is disposed thereon to block a moisture permeation path. Therefore, the electrolytic corrosion defect of the COF due to the film lifting can be suppressed, minimized, or eliminated by the present disclosure.

The effects according to the present disclosure are not limited to the contents exemplified above, and more various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
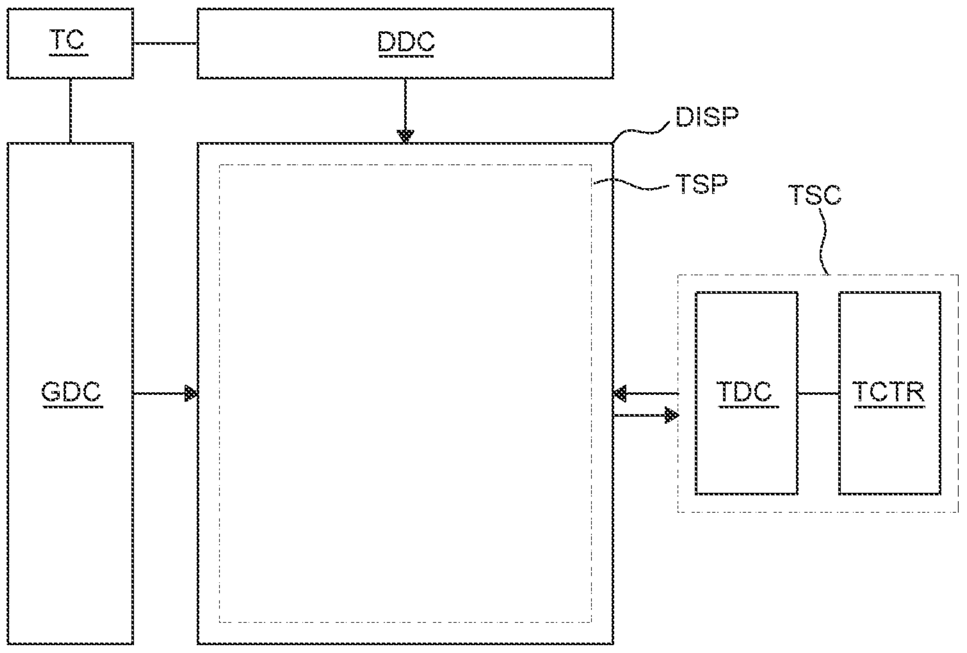
FIG. 1 is a view schematically illustrating a configuration of a display apparatus according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The term "exemplary" or "exemplarily" is used to mean an example, and is interchangeably used with the term "example". Further, embodiments are example embodiments and aspects are example aspects. Any implementation described herein as an "exemplary", "exemplarily" or "example" is not necessarily to be construed as preferred or advantageous over other implementations.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "comprising," "including," "having," "consist of," etc. used herein are generally intended to allow other components to be added unless the terms are used with the term "only". Any references to singular can include plural unless expressly stated otherwise.

In construing an element, the element is construed as including an error range although there is no explicit description.

In describing a position relationship, for example, when a position relation between two parts is described as "on," "over," "above," "under," "below," and "next", etc., one or more other parts can be disposed between the two parts unless "just(ly)" or "direct(ly)" is used.

In describing a time relationship, for example, when the temporal order is described as 'after~', 'subsequent~', 'next~', and 'before~', a case which is not continuous can be included unless "just(ly)" or "direct(ly)" is used.

It will be understood that, although the terms "first," "second," etc. can be used herein to describe various elements, these elements should not be limited by these terms. These terms are only used to distinguish one element from another, and may not define order or sequence. For example, a first element could be termed a second element, and, similarly, a second element could be termed a first element, without departing from the scope of the present disclosure.

In describing the elements of the present disclosure, terms such as first, second, A, B, (a), (b), etc., can be used. Such terms are used for merely discriminating the corresponding elements from other elements and the corresponding elements are not limited in their essence, sequence, precedence, or number by the terms. It will be understood that when an element is referred to as being "coupled" or "connected to" another element, it can be directly coupled or directly connected to the other element, or intervening other element (s) can be present therebetween.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

In the present disclosure, examples of a display apparatus can include a narrow-sense display apparatus such as a quantum dot (QD) module, an organic light emitting diode (OLED) module or a liquid crystal module (LCM) having a display panel and a driver for driving the display panel. Further, examples of the display apparatus can include a set device (or a set apparatus) or a set electronic apparatus such as a notebook computer, a TV, a computer monitor, an equipment apparatus including an automotive apparatus or another type of apparatus for vehicles, or a mobile electronic device such as a smartphone or an electronic pad, which is a complete product (or a final product) including an LCM, an OLED module, and a QD module.

Therefore, in the present disclosure, examples of the display apparatus can include a narrow-sense display apparatus itself, such as an LCM, an OLED module, and a QD module, and a set device, which is a final consumer device or an application product including the LCM, the OLED module, and the QD module.

In some embodiments, an LCM, an OLED module, and a QD module including a display panel and a driver can be referred to as a narrow-sense display apparatus, and an electronic apparatus, which is a final product including an LCM, an OLED module, and a QD module can be referred to as a set apparatus. For example, the narrow-sense display apparatus can include a display panel, such an LCM, an OLED module, or a QD module, and a source printed circuit board (PCB), which is a controller for driving the display panel. The set apparatus can further include a set PCB, which is a set controller electrically connected to the source PCB to overall control the set apparatus.

A display panel applied to embodiments of the present disclosure can use any type of display panel, including a liquid crystal display panel, an organic light emitting diode (OLED) display panel, a quantum dot (QD) display panel, and an electroluminescent display panel. The display panel of the embodiment is not limited to a specific display panel capable of bezel bending with a flexible substrate for an organic light emitting diode (OLED) display panel and a lower back plate support structure. Further, a shape or a size of a display panel applied to a display device according to these embodiments is not limited.

In an example where the display panel is the organic light emitting display panel, the display panel can include a plurality of gate lines, data lines, and pixels respectively provided in intersections of the gate lines and the data lines. Further, the display panel can include an array including a thin film transistor (TFT), which is an element for selectively applying a voltage to each of the pixels, a light emitting element layer on the array, and an encapsulation substrate or an encapsulation layer disposed on the array to cover the light emitting element layer. The encapsulation substrate can protect the TFT and the light emitting element layer from an external impact and can prevent water or oxygen from penetrating into the light emitting element layer. Further, a layer provided on the array can include an inorganic light emitting layer, for example, a nano-sized material layer, a quantum dot, or the like.

Features of various embodiments of the present disclosure can be partially or overall coupled to or combined with each other, and can be variously inter-operated with each other and driven technically. Embodiments of the present disclosure can be carried out independently from each other, or can be carried out together in co-dependent relationship.

Hereinafter, embodiments of the present disclosure are considered through the accompanying drawings and examples as follows. Since scales of components shown in the drawings have different scales from actual ones for convenience of explanation, they are not limited to the scales shown in the drawings. Further, all the components of each display apparatus according to all embodiments of the present disclosure are operatively coupled and configured.

FIG. 1 is a view schematically illustrating a configuration of a display apparatus according to an exemplary embodiment of the present disclosure. For example, FIG. 1 is a view illustrating a schematic configuration of a display apparatus in which a touch panel according to an exemplary embodiment of the present disclosure is embedded.

Referring to FIG. 1, the display apparatus according to the exemplary embodiment of the present disclosure can provide both a function for displaying images and a function for sensing a touch.

In order to provide an image displaying function, the display apparatus according to the exemplary embodiment of the present disclosure can include a display panel DISP, a gate driving circuit GDC, a data driving circuit DDC, and a timing controller TC.

For example, in the display panel DISP, a plurality of data lines and a plurality of gate lines are disposed and a plurality of sub pixels defined by the plurality of data lines and the plurality of gate lines can be disposed.

The data driving circuit DDC drives the plurality of data lines and the gate driving circuit GDC drives the plurality of gate lines, and the timing controller TC can control an operation of the data driving circuit DDC and the gate driving circuit GDC.

Each of the data driving circuit DDC, the gate driving circuit GDC, and the timing controller TC can be implemented by one or more individual components. In some cases, two or more of the data driving circuit DDC, the gate driving circuit GDC, and the timing controller TC can be integrally implemented as one component. For example, the data driving circuit DDC and the timing controller TC can also be implemented as one integrated circuit chip (IC chip).

In order to provide a touch sensing function, the display apparatus according to exemplary embodiment of the present disclosure can include a touch panel TSP and a touch sensing circuit TSC. The touch panel TSP includes a plurality of touch electrodes. The touch sensing circuit TSC supplies a touch driving signal to the touch panel TSP, and detects a touch sensing signal from the touch panel TSP to sense the presence of a touch of a user or a touch position (touch coordinate) in the touch panel TSP based on the detected touch sensing signal.

For example, the touch sensing circuit TSC can include a touch driving circuit TDC and a touch controller TCTR. The touch driving circuit TDC supplies a touch driving signal to the touch panel TSP and detects a touch sensing signal from the touch panel TSP. The touch controller TCTR senses the presence of a touch of a user and/or a touch position in the touch panel TSP based on the touch sensing signal detected by the touch driving circuit TDC. The touch driving circuit TDC can include a first circuit part which supplies the touch driving signal to the touch panel TSP and a second circuit part which detects the touch sensing signal from the touch panel TSP.

For example, the touch driving circuit TDC and the touch controller TCTR can be implemented by separate components or in some cases, can also be integrally implemented as one component.

For example, each of the data driving circuit DDC, the gate driving circuit GDC, and the touch driving circuit TDC can be implemented by one or more integrated circuits. From the viewpoint of electrical connection with the display panel DISP, the circuits can be implemented by a chip on glass (COG) type, a chip on film (COF) type, or a tape carrier package (TCP) type. Further, the gate driving circuit GDC can also be implemented by a gate in panel (GIP) type.

For example, each of circuit configurations DDC, GDC, and TC for display driving and circuit configurations TDC and TCTR for touch sensing can be implemented by one or more individual components. In some cases, one or more of circuit configurations DDC, GDC, and TC for display driving and one or more of circuit configurations TDC and TCTR for touch sensing can be functionally integrated to be implemented by one or more components.

For example, the data driving circuit DDC and the touch driving circuit TDC can be integrally implemented in one or two or more integrated circuit chips. When the data driving circuit DDC and the touch driving circuit TDC are integrally implemented in two or more integrated circuit chips, each of two or more integrated circuit chips can have a data driving function and a touch driving function.

In the meantime, the display apparatus according to the exemplary embodiments of the present disclosure can be various types such as a light emitting display apparatus or a liquid crystal display apparatus. Hereinafter, for the convenience of description, a light emitting display apparatus will be described as an example of the display apparatus. For example, even though the display panel DISP can be various types such as a light emitting display panel or a liquid crystal display panel, in the following description, for the convenience of description, a light emitting display panel will be described as an example of the display panel DISP.

Further, as it will be described below, the touch panel TSP can include a plurality of touch electrodes which is applied with a touch driving signal or can detect a touch sensing signal therefrom and a plurality of touch routing lines for connecting the plurality of touch electrodes to the touch driving circuit TDC.

The touch panel TSP can be provided at the outside of the display panel DISP. For example, the touch panel TSP and the display panel DISP can be separately manufactured to be combined. Such a touch panel TSP is called an external type or an add-on type.

In contrast, the touch panel TSP can be embedded in the display panel DISP. For example, when the display panel DISP is manufactured, a touch sensor structure such as a plurality of touch electrodes and a plurality of touch routing lines which configure a touch panel TSP can be formed together with a plurality of electrodes and signal lines for display driving.

Further, the touch panel TSP can also be formed directly above the encapsulation layer of the display panel DISP. For example, the touch insulating film and the touch electrodes are patterned above the encapsulation layer and the touch panel is connected to signal lines formed as electrodes for display driving to be driven. Hereinafter, for the convenience of description, an example that the touch panel TSP is formed directly above the encapsulation layer will be described.

Figure 2:
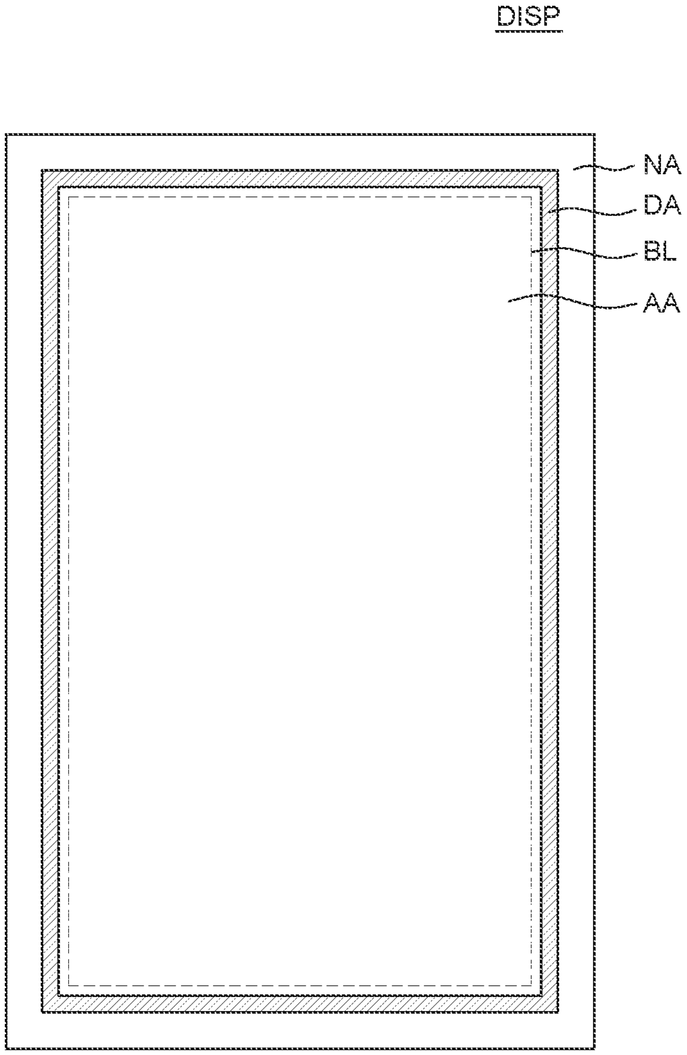
FIG. 2 is a view schematically illustrating an example of a display panel of FIG. 1.

FIG. 2 is a view schematically illustrating an example of a display panel of FIG. 1.

Referring to FIG. 2, the display panel DISP can include an active area (or display area) AA in which images are displayed and a non-active area (or non-display area) NA which is an outer area of an outer boundary line BL of the active area AA.

In the active area AA of the display panel DISP, a plurality of sub pixels for displaying images is disposed and various electrodes or signal lines for display driving are disposed.

Further, in the active area AA of the display panel DISP, a plurality of touch electrodes for touch sensing and a plurality of touch routing lines electrically connected thereto can be disposed. Accordingly, the active area AA can also be referred to as a touch sensing area which is capable of touch sensing.

In the non-active area NA of the display panel DISP, link lines extending from various signal lines disposed in the active area AA or link lines which are electrically connected to various signal lines disposed in the active area AA, and pads which are electrically connected to the link lines can be disposed. The pads disposed in the non-active area NA can be bonded or electrically connected with the display driving circuit.

Further, in the non-active area NA of the display panel DISP, link lines extending from a plurality of touch routing lines disposed in the active area AA or link lines which are electrically connected to a plurality of touch routing lines disposed in the active area AA, and pads which are electrically connected to the link lines can be disposed. The pads disposed in the non-active area NA can be bonded or electrically connected with the touch driving circuit.

In the non-active area NA, a part of an outermost touch electrode among a plurality of touch electrodes disposed in the active area AA is expanded, or one or more electrodes (touch electrodes) formed of the same material as the plurality of touch electrodes disposed in the active area AA can also be further disposed.

For example, all the plurality of touch electrodes disposed in the display panel DISP can be disposed in the active area AA, or some (for example, an outermost touch electrode) among the plurality of touch electrodes disposed in the display panel DISP can be disposed in the non-active area NA. Some (for example, an outermost touch electrode) among the plurality of touch electrodes disposed in the display panel DISP can also be disposed in both the active area AA and the non-active area NA. The non-active area NA can surround the active area AA entirely or only in part, and one or more non-active areas NA can be provided adjacent or surrounding the active area AA. Although the shapes of the active area and non-active area AA and NA are rectangular, other shapes are possible.

In the meantime, referring to FIG. 2, the display panel DISP according to the exemplary embodiment of the present disclosure can include a dam area DA having a dam for suppressing any layer (for example, the encapsulation layer in the light emitting display panel) in the active area AA from passing over the display panel DISP.

The dam area DA can be located at a boundary of the active area AA and the non-active area NA or at any one position of a non-active area NA which is an outer area of the active area AA.

The dam disposed in the dam area DA can be disposed to enclose all directions of the active area AA or also disposed only at an outside of one or two or more parts of the active area AA.

The dam disposed in the dam area DA can also have one pattern in which all the dams are connected or two or more separated patterns. Further, in the dam area DA, only a primary dam can also be disposed or two or more dams (primary dam and secondary dam) can also be disposed, or three or more dams can also be disposed.

For example, in the dam area DA, in any one direction, only the primary dam is disposed and in the other direction, both the primary dam and the secondary dam can also be disposed.

Figure 3:
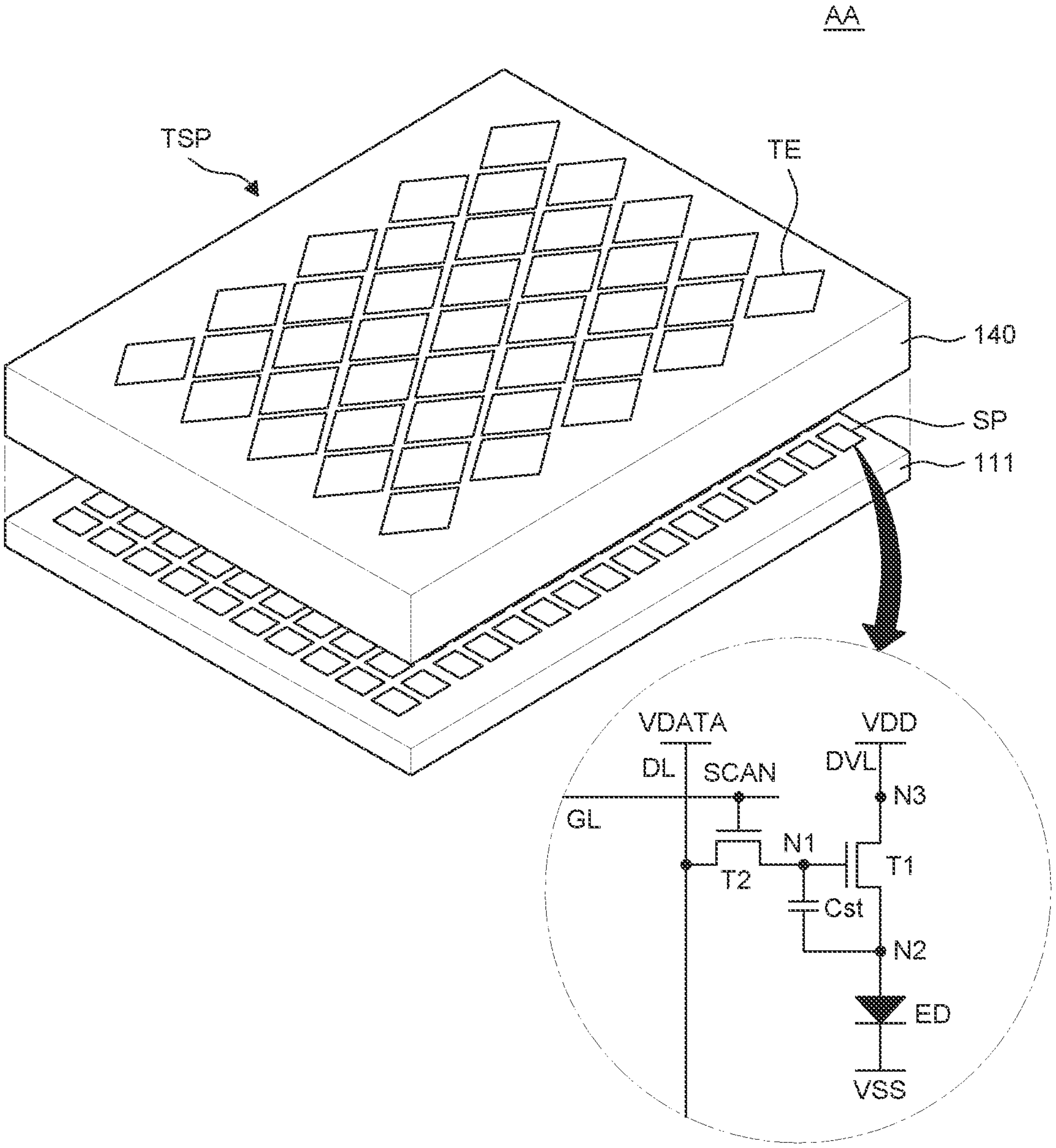
FIG. 3 is a perspective view illustrating a structure in which a touch panel is embedded in a display panel according to an exemplary embodiment of the present disclosure.

FIG. 3 is a perspective view illustrating a structure in which a touch panel is embedded in a display panel according to an exemplary embodiment of the present disclosure.

Referring to FIG. 3, in the active area AA of the display panel, a plurality of sub pixels SP can be disposed above a substrate 111.

Each sub pixel SP can include a light emitting diode ED, a first transistor T1 for driving the light emitting diode ED, a second transistor T2 for transmitting a data voltage VDATA to a first node N1 of the first transistor T1, and a storage capacitor Cst for maintaining a constant voltage for one frame.

For example, the first transistor T1 can include a first node N1 to which the data voltage VDATA can be applied, a second node N2 which is electrically connected to the light emitting diode ED, and a third node N3 to which a driving voltage VDD is applied from a driving voltage line DVL. The first node N1 is a gate node, the second node N2 can be a source node or a drain node, and the third node N3 can be a drain node or a source node. The first transistor T1 can be referred to as a driving transistor which drives the light emitting diode ED.

The light emitting diode ED can include a first electrode (for example, an anode), an emission layer, and a second electrode (for example, a cathode). The first electrode is electrically connected to the second node N2 of the first transistor T1 and the second electrode can be applied with a base voltage VSS.

The emission layer in such a light emitting diode ED can be a light emitting diode including an organic material or an inorganic material.

For example, the second transistor T2 is controlled to be turned on or off by a scan signal SCAN applied through the gate line GL and can be electrically connected between the first node N1 of the first transistor T1 and the data line DL. Such a second transistor T2 can be referred to as a switching transistor.

For example, when the second transistor T2 is turned on by the scan signal SCAN, the second transistor T2 can transmit the data voltage VDATA supplied from the data line DL to the first node N1 of the first transistor T1.

The storage capacitor Cst can be electrically connected between the first node N1 and the second node N2 of the first transistor T1.

As illustrated in FIG. 3, each sub pixel SP can have a 2T1C structure including two transistors T1 and T2 and one capacitor Cst, and in some cases, can further include one or more transistors or can further include one or more capacitors. However, each sub pixel SP can have a circuit structure among various different structures.

The storage capacitor Cst can be an external capacitor which is intentionally designed at the outside of the first transistor T1, rather than a parasitic capacitor (for example, Cgs or Cgd) which is an internal capacitor which can be formed between the first node N1 and the second node N2 of the first transistor T1.

The first transistor T1 and the second transistor T2 can be configured by an n-type transistor or a p-type transistor. As described above, in the display panel, circuit elements such as a light emitting diode ED, two or more transistors T1 and T2, and one or more capacitors Cst are disposed. The circuit element (specifically, the light emitting diode ED) can be vulnerable to external moisture or oxygen so that the encapsulation layer 140 for suppressing the external moisture or oxygen from permeating the circuit element can be disposed on the display panel.

The encapsulation layer 140 can be formed by one layer, or also formed by a plurality of layers.

In the meantime, in the display apparatus according to the exemplary embodiment of the present disclosure, the touch panel TSP can be disposed above the encapsulation layer 140.

In the display apparatus according to the exemplary embodiment of the present disclosure, a touch sensor structure, such as a plurality of touch electrodes TE which forms a touch panel TSP, can be disposed above the encapsulation layer 140.

During the touch sensing, a touch driving signal or a touch sensing signal can be applied to the touch electrode TE. Accordingly, during the touch sensing, a potential difference is formed between the touch electrode TE and the cathode which are disposed with the encapsulation layer 140 therebetween so that unnecessary parasitic capacitance can be formed. At this time, the parasitic capacitance may degrade a touch sensitivity. Therefore, in order to reduce or control the parasitic capacitance, a distance between the touch electrode TE and the cathode can be designed to be larger than a predetermined value (for example, 1 μm) in consideration of a display panel thickness, a display panel manufacturing process, and a display performance. To this end, for example, the thickness of the encapsulation layer 140 can be designed to be at least 1 μm.

Figure 4:
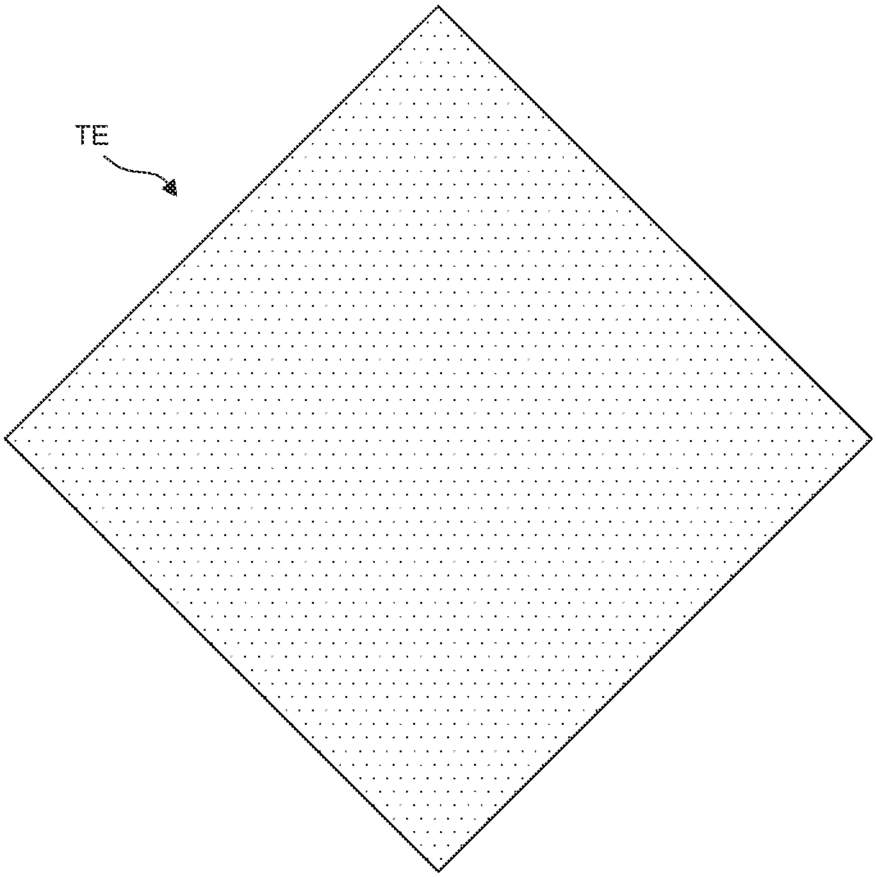
FIGS. 4 to 6 are views illustrating various types of a touch electrode in a display apparatus according to an exemplary embodiment of the present disclosure.
Figure 5:
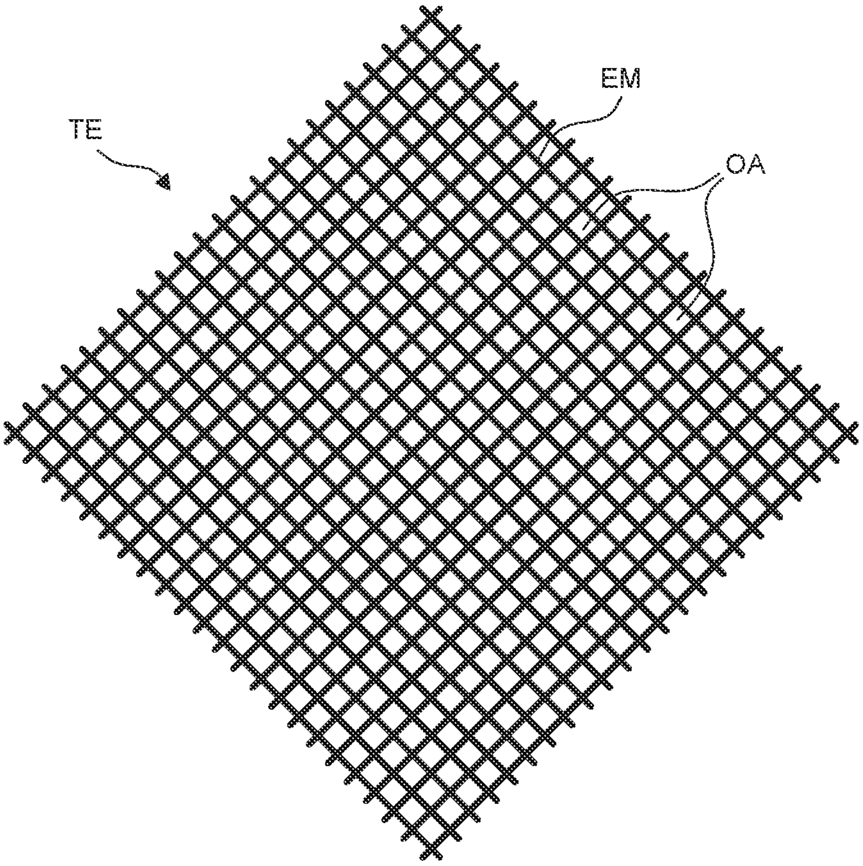
Figure 6:
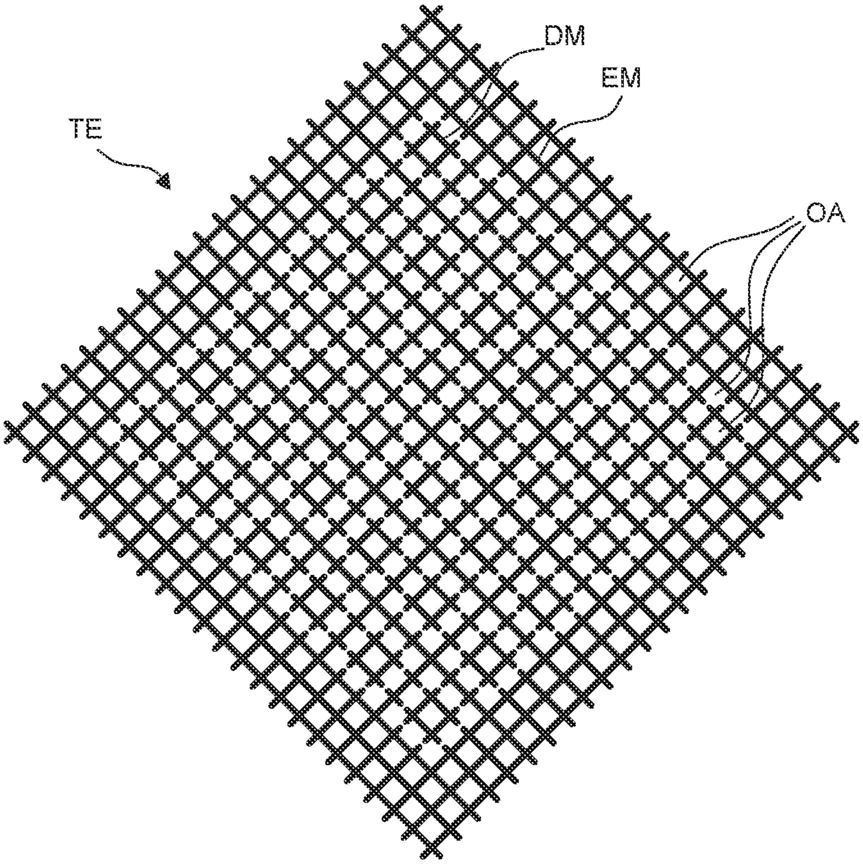

FIGS. 4 to 6 are views illustrating various types of a touch electrode in a display apparatus according to an exemplary embodiment of the present disclosure.

Particularly, FIGS. 4 and 5 are exemplary views illustrating types of a touch electrode TE disposed in a display panel according to exemplary embodiments of the present disclosure. FIG. 6 is an exemplary view illustrating a mesh-type touch electrode TE of FIG. 5.

Referring to FIG. 4, each touch electrode TE disposed on the display panel can be a planar electrode which does not have an opening. In this case, each touch electrode TE can be a transparent electrode. For example, each touch electrode TE can be configured by a transparent electrode material so that light emitted from a plurality of sub pixels disposed therebelow can be upwardly transmitted.

In contrast, referring to FIG. 5, each touch electrode TE disposed in the display panel can be an electrode metal EM which is patterned to a mesh type to have two or more openings OA.

The electrode metal EM is a portion which corresponds to a substantial touch electrode TE so that a touch driving signal is applied or a touch sensing signal is sensed thereby.

Referring to FIG. 5, when each touch electrode TE is an electrode metal EM patterned in a mesh type, there can be two or more openings OA in an area of the touch electrode TE.

Each of the two or more openings OA in each touch electrode TE can correspond to an emission area of one or more sub pixels. For example, a plurality of openings OA becomes paths through which light emitted from a plurality of sub-pixels passes upwardly. Hereinafter, for the convenience of description, it will be described that each touch electrode TE is a mesh type electrode metal EM as an example.

The electrode metal EM corresponding to each touch electrode TE can be located on a bank which is disposed in an area, other than the emission area of the sub pixel.

In the meantime, in order to form a plurality of touch electrodes TE, the electrode metal ME is widely formed to be a mesh type and then the electrode metal is cut to have a predetermined pattern to electrically isolate the electrode metals EM. Consequently, a plurality of touch electrodes TE can also be created.

An outline shape of the touch electrode TE can be a square shape such as a diamond shape or a rhombus or can be various shapes such as a triangle, a pentagon, or a hexagon, as illustrated in FIGS. 4 and 5.

Next, referring to FIG. 6, in an area of each touch electrode TE, one or more dummy metals DM which are disconnected from the mesh type electrode metal EM can be provided.

The electrode metal EM is a part corresponding to a substantial touch electrode TE, and in the electrode metal, a touch driving signal is applied or a touch sensing signal is sensed. However, the dummy metal DM is present in the region of the touch electrode TE, but in the dummy metal, the touch driving signal is not applied and the touch sensing signal is not sensed. For example, the dummy metal DM can be an electrically floated metal.

Accordingly, the electrode metal EM can be electrically connected to the touch driving circuit, but the dummy metal DM is not electrically connected to the touch driving circuit.

In the area of each touch electrode TE, one or more dummy metals DM can be provided to be disconnected from the electrode metal EM. FIG. 6 illustrates a structure in which the dummy metal DM is disposed in a partial area in the area of the touch electrode TE, but the dummy metal DM can also be present in the entire area in the area of the touch electrode TE. Further, the dummy metal DM can also be included or may not also be included depending on the position in which the touch electrode TE is disposed.

For example, only in the area of each of some touch electrodes TE among all touch electrodes TE, one or more dummy metals DM can also be provided to be disconnected from the electrode metal EM. For example, in an area of the other touch electrodes TE, the dummy metal DM may not also be provided.

In the meantime, with regard to the role of the dummy metal DM, as illustrated in FIG. 5, when there is no dummy metal DM in the area of the touch electrode TE, but only the electrode metal EM is provided as a mesh type, there can be a visibility issue that an outline of the electrode metal EM is visible on a screen.

In contrast, as illustrated in FIG. 6, when one or more dummy metals DM are provided in the area of the touch electrode TE, the visibility issue that an outline of the electrode metal EM is visible on the screen can be suppressed.

Further, for each touch electrode TE, the presence, or the number of dummy metals DM (a ratio of dummy metals) is adjusted so that a magnitude of capacitance is adjusted for each touch electrode TE, to improve a touch sensitivity.

In the meantime, some branches of the electrode metal EM formed in the area of one touch electrode TE are cut so that the cut electrode metal EM can be formed as a dummy metal DM. For example, the electrode metal EM and the dummy metal DM can be the same material formed on the same layer.

In the meantime, the display apparatus according to the exemplary embodiment of the present disclosure can sense the touch based on capacitance formed in the touch electrode TE.

The display apparatus according to the exemplary embodiments of the present disclosure employs a capacitance-based touch sensing manner so that the touch can also be sensed by a mutual-capacitance based touch sensing manner or a self-capacitance-based touch sensing manner.

For example, according to the mutual-capacitance based touch sensing manner, a plurality of touch electrodes TE can be classified into a driving touch electrode (a transmission touch electrode) to which a touch driving signal is applied and a sensing touch electrode (a reception touch electrode) which detects a touch sensing signal and forms a capacitance with the driving touch electrode.

In the case of the mutual-capacitance based touch sensing manner, the touch sensing circuit can sense the presence of the touch and/or the touch coordinate based on the change in capacitance between the driving touch electrode and the sensing touch electrode (mutual-capacitance) depending on the presence of a pointer such as a finger or a pen.

According to the self-capacitance-based touch sensing manner, each touch electrode TE can serve as both a driving touch electrode and a sensing touch electrode. For example, the touch sensing circuit applies a touch driving signal to one or more touch electrodes TE, and detects a touch sensing signal by means of the touch electrode TE applied with the touch driving signal. The touch sensing circuit identifies the change in capacitance between a pointer such as a finger or a pen and the touch electrode TE based on the detected touch sensing signal to sense the presence of touch and/or the touch coordinate. In the self-capacitance-based touch sensing manner, the driving touch electrode and the sensing touch electrode are not distinguished.

As described above, the display apparatus according to the exemplary embodiment of the present disclosure can also sense the touch by the mutual-capacitance based touch sensing manner or the self-capacitance-based touch sensing manner. However, in the following description, for the convenience of description, it will be described that the display apparatus performs mutual-capacitance based touch sensing and includes a touch sensor structure therefor, as an example.

Hereinafter, the configurations of the touch pad and the display pad, the configurations of first and second touch electrodes, and the configuration of each link line according to examples of the present disclosure will be described in more detail with reference to the drawings.

Figure 7:
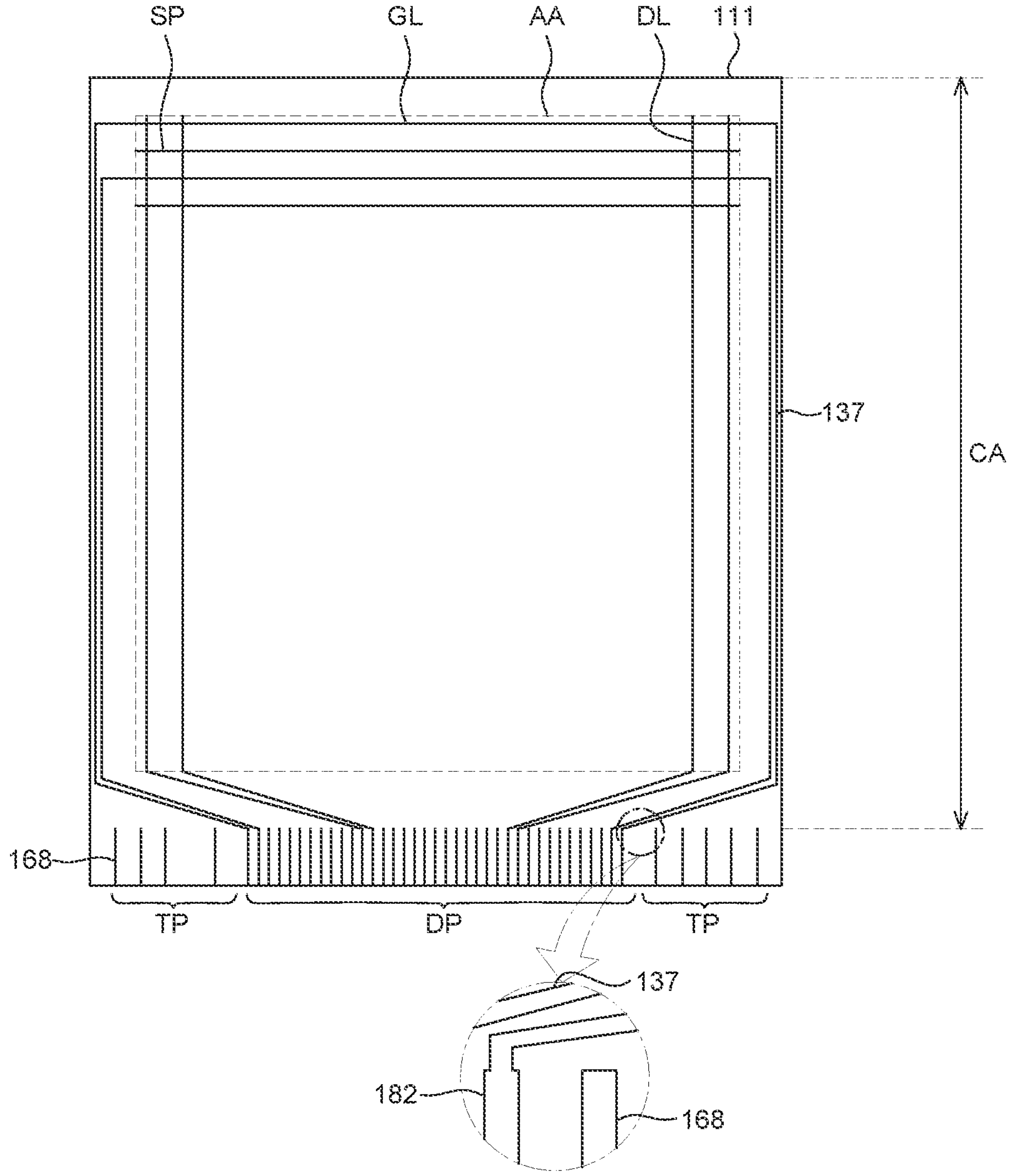
FIG. 7 is a plan view illustrating a display apparatus according to an exemplary embodiment of the present disclosure, after forming a first display pad electrode and a first touch pad electrode.

FIG. 7 is a plan view illustrating a display apparatus according to an exemplary embodiment of the present disclosure, after forming a first display pad electrode and a first touch pad electrode.

Figure 8:
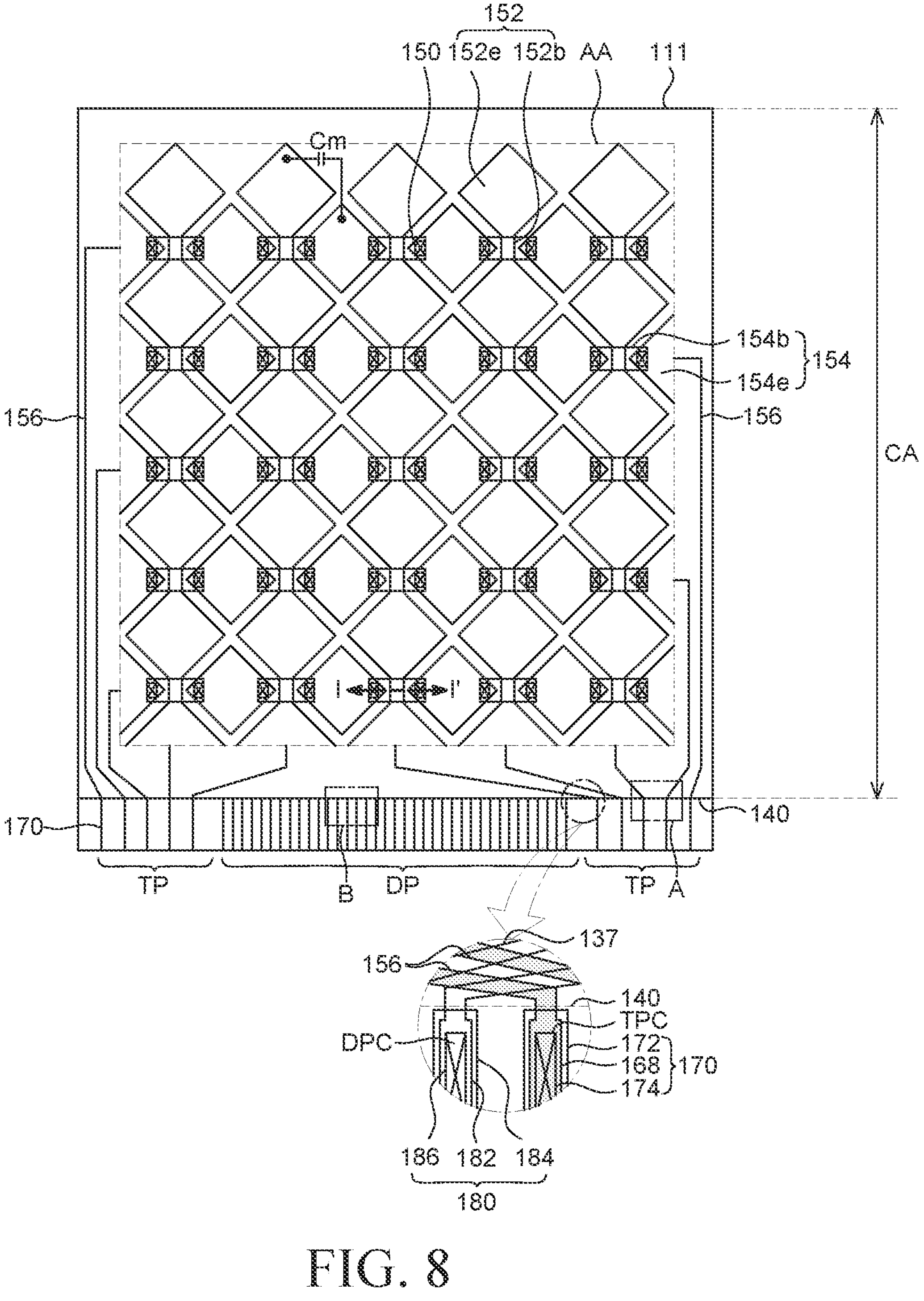
FIG. 8 is a plan view illustrating a display apparatus according to an exemplary embodiment of the present disclosure, after forming a second display pad electrode and a second touch pad electrode.

FIG. 8 is a plan view illustrating a display apparatus according to an exemplary embodiment of the present disclosure, after forming a second display pad electrode and a second touch pad electrode.

For example, FIG. 7 is a plan view illustrating a light emitting display apparatus with a touch screen of the present disclosure after forming a first display pad electrode and a first touch pad electrode. FIG. 8 is a plan view illustrating a light emitting display apparatus with a touch screen of the present disclosure after forming a second display pad electrode and a second touch pad electrode.

In FIGS. 7 and 8, in a portion denoted by a CA area, the encapsulation layer 140 is disposed. The illustrated example shows an example that the encapsulation layer 140 can be exposed to the portion of the touch pad TP and the display pad, and the encapsulation layer 140 covers the remaining active area AA and a non-active area in which the touch pad TP and the touch pad DP are not located. A display link line 137 which connects the display pad DP and a wiring line, such as the gate line GL and the data line DL located in the active area AA above the substrate 111 is disposed in the non-active area. However, when the touch link line 156 is disposed on the same plane, the touch link line can overlap the display link line 137 which is formed earlier by the process of forming a thin film transistor. Therefore, the encapsulation layer 140 is disposed also in the non-active area excluding the touch pad TP and the display pad DP to suppress electric interference and short between the touch link line 156 and the display link line 137. For example, the touch link line 156 can be disposed above the encapsulation layer 140 which covers the display link line 137. The first touch electrode 152 and the second touch electrode 154 can be disposed above the encapsulation layer 140.

Referring to FIG. 7, the first touch pad electrode 168 of the touch pad TP and the first display pad electrode 182 of the display pad DP according to the exemplary embodiment of the present disclosure can be formed by an array process of forming a gate line GL, a data line DL, a thin film transistor (T1 and T2 of FIG. 3), and a storage capacitor (Cst of FIG. 3) in the active area AA. During this process, as illustrated in the enlarged view of a lower portion of FIG. 7, the display link line 137 can be integrally formed with the first display pad electrode 182 of the display pad DP with the metal on the same layer as the gate line GL or the data line DL without being disconnected.

In the meantime, the display link line 137 can also be provided with two or more layers of laminated structure or can also be located on different layers for every area, according to a layered structure such as the gate line GL, the data line DL, or a power voltage line disposed in the active area AA.

In contrast, the first touch pad electrode 168 is selectively formed in the portion of the touch pad TP to have an island shape on the same layer as the gate line GL or the data line DL.

Here, as illustrated in FIG. 7, the interval between the first touch pad electrodes 168 can have a larger space than the interval between the first display pad electrodes 182. This is because the number of gate lines GL and the data lines DL disposed in every sub pixel in the active area AA is larger than the number of unit touch patterns of the first and second touch electrodes disposed to have a size to sense the touch. Therefore, the display pad DP can be disposed more densely than the touch pads TP. However, it is not limited thereto and the touch pad TP and the display pad DP are disposed with the same interval and the touch pad TP and the display pad DP can also be disposed in the center of one side or locally concentrated.

For example, after forming a plurality of sub pixels SP including a thin film transistor and a pixel driving circuit such as a gate line GL and a data line DL which intersect each other, above the substrate 111, together with the first display pad electrode 182, the first touch pad electrode 168, and the display link line 137, the light emitting diode (ED of FIG. 3) which is connected to the pixel driving circuit is formed. Thereafter, the encapsulation layer covering them can be formed. The portion of the touch pad TP and the display pad DP can be exposed from the encapsulation layer.

Next, referring to FIG. 8, the first and second touch electrodes 152 and 154 can be formed above the encapsulation layer 140.

The first and second touch electrodes 152 and 154 are disposed in an intersecting direction with each other and any one can serve as a touch driving line and the other one can serve as a touch sensing line.

For example, the first touch electrode 152 can include a plurality of first touch patterns **152*e* disposed in a Y direction (e.g., a vertical direction of FIG. 8) and a first bridge 152*b* which integrally connects the adjacent first touch patterns 152*e***.

For example, the second touch electrode 154 can include a plurality of second touch patterns **154*e* spaced apart in an X direction (e.g., a horizontal direction of FIG. 8) and a second bridge 154*b* which electrically connects the adjacent second touch patterns 154*e*** on different layers.

The first touch pattern **152*e* and the second touch pattern 154*e* can be located on the same layer and the second bridge 154*b* and the first and second touch patterns 152*e* and 154*e* can be located with a touch insulating film therebetween. Further, for example, the second bridge 154*b* is located on a different layer from the first touch pattern 152*e* and the second touch pattern 154*e* with the touch insulating film therebetween at the intersection of the first touch electrode 152 and the second touch electrode 154. The second bridge 154*b* can be connected to the second touch pattern 154*e* through a touch connection hole 150** provided in the touch insulating film.

The first bridge **152*b* can be integrated with the first touch pattern 152*e***.

Here, the touch pad TP includes touch pad electrodes on a plurality of layers and the touch link line 156 is formed together when the first and second touch electrodes 152 and 154 are formed and can be located on the same layer as the second bridge **154*b***.

For example, the touch link line 156 extends to the touch pad TP to be connected to the first connection pad electrode 172 having an island shape, which is in contact with the first touch pad electrode 168. The second touch pad electrode 174 having an island shape can also be disposed on the first connection pad electrode 172 so as to overlap the first connection pad electrode 172. The second touch pad electrode 174 can also be omitted as needed.

The second connection pad electrode 184 having an island shape which is in contact with the first display pad electrode 182 can be disposed on the first display pad electrode 182 at the side of the display pad DP. The second display pad electrode 186 having an island shape can be disposed on the second connection pad electrode 184 so as to overlap the second connection pad electrode 184. The second display pad electrode 186 can also be omitted as needed.

As described above, the second touch pad electrode 174 and the second display pad electrode 186 which are transparent conductive films can be disposed on the uppermost side of the touch pad TP (which is also be indicated as 170 in FIG. 8) and the display pad DP (which is also be indicated as 180 in FIG. 8). As described above, the second touch pad electrode 174 and the second display pad electrode 186 can be omitted as needed.

For example, the touch pad 170 can be configured by a first touch pad electrode 168, a first connection pad electrode 172 and a second touch pad electrode 174 connected to the touch link line 156 which are connected to each other on different layers.

For example, the display pad 170 can be configured by the first display pad electrode 182, the second connection pad electrode 184, and the second display pad electrode 186 which are connected to each other on different layers.

Here, the electric connection of metals on different layers in the touch pad TP (or the touch pad 170) is referred to as a touch pad connection unit TPC and the electric connection of metals on different layers in the display pad DP (or the display pad 180) can be referred to as a display pad connection unit DPC.

The structure of FIG. 8 illustrates an example that the second touch electrode 154 disposed in a horizontal direction has a second bridge **154*b* on a different layer from the second touch pattern 154*e*. However, a form in which the first touch electrode 152 disposed in a vertical direction has a first bridge 152*b* on a different layer from the first touch pattern 152*e*** can also be applied.

The first and second touch patterns **152*e* and 154*e*** are not limited to a single layer. If necessary or desired, in order to suppress the RC delay and improve the touch sensitivity, a mesh pattern which is formed of a metal component can be applied to be laminated on a polygonal touch pattern having a transparent electrode component with a predetermined area. In this case, the mesh pattern can also be in contact with a touch pattern below or above the touch pattern having a transparent electrode component and, in some cases, the mesh pattern can also be disposed above or below the transparent electrode. Alternatively, a transparent electrode component with a predetermined area is disposed above and below the mesh pattern to configure the touch pattern.

Here, the mesh pattern can use at least any one of Al, Ti, Cu, and Mo or an alloy including any one thereof and the transparent electrode can use a transparent conductive film, such as indium tin oxide (ITO) or indium zinc oxide (IZO). When the mesh pattern is formed to have a very small line width, even though the mesh pattern is located above the transparent electrode, the degradation of the aperture rate or the transmittance can be suppressed.

In the meantime, the touch link line 156 is formed on the same layer as the second bridge **154*b* having a metal component which is a different layer from the first and second touch patterns 152*e* and 154*e***. if the mesh pattern is provided, the touch link line can be disposed on the same layer as the mesh pattern.

For example, the configuration of the touch pad TP completed after forming the first and second touch electrodes 152 and 154 can include a first touch pad electrode 168 formed by the array process and a second touch pad electrode 174 formed by the same process as the first and second touch patterns 152*e* and 154*e*. In the illustrated example, an example that the touch link line 156 extends toward the touch pad TP to be connected to the first connection pad electrode 172 configured to be connected to a lower portion of the second touch pad electrodes 174 and an upper portion of the first touch pad electrodes 168 is illustrated.

In the layered structure of the display pad DP, like the touch pad TP, a first display pad electrode 182 on the same layer as the source electrode and the drain electrode, a second connection pad electrode 184 on the same layer as the first connection pad electrode 172, and a second display pad electrode 186 disposed on the same layer as the second touch pad electrode 174 can be laminated from the bottom. Accordingly, the pads can be connected without a step by means of a single flexible printed circuit board and an anisotropic conductive film corresponding to the same side. For example, the flexible printed circuit board includes bump electrodes corresponding to the touch pad TP and the display pad DP, and the bump electrodes are connected to a drive IC or a control chip equipped in the flexible printed circuit board to be applied with an electric signal. Further, in the anisotropic conductive film, the conductive balls are mixed between adhesive layers. Therefore, when the flexible printed circuit board is corresponded with one side of the substrate 111 on which the display pad DP and the touch pad TP are disposed, and then is applied with a predetermined pressure to be bonded, the internal conductive balls are broken to form the electric connection between the bump electrode and the touch pad TP or the display pad DP.

In the display apparatus according to the exemplary embodiment of the present disclosure, the touch pad TP and the display pad DP are aligned on the same side of the substrate 111 so that a portion which forms the electric connection with the flexible printed circuit board on the substrate 111 to be applied with a signal is unified as one side of the substrate 111. Accordingly, a portion on which the flexible printed circuit board and an upper portion of the substrate 111 are bonded becomes one side of the substrate 111. Therefore, if the pressure spreadability is caused by the pressure during the bonding and the pressure in the adhesive layer in the anisotropic conductive film, at least a space between the flexible printed circuit board and the active area AA is disposed in one area. By doing this, the physical configuration of the circuit unit on the substrate 111 can be simplified. Accordingly, a form factor can be improved.

A mutual capacitance Cm is formed in an adjacent portion of the first and second touch electrodes 152 and 154. Accordingly, the mutual capacitance Cm serves as a touch screen by charging charges by a touch driving pulse supplied to the first touch electrode 152 or the second touch electrode 154 having a function of the touch driving line, and by discharging the charged charges to the second touch electrode 154 or the first touch electrode 152 having a function of the touch sensing line.

For example, the touch link line 156 can transmit a touch driving pulse generated in the touch driver provided on the flexible printed circuit board through the touch pad 170 to any one of the first touch electrode 152 and the second touch electrode 154, and transmit a touch signal generated from the other one to the touch pad 170. The touch link line 156 is disposed between edges of the first and second touch electrodes 152 and 154 of the active area AA and the touch pad 170. When the touch link line 156 is integrally formed with the bridge or the first or second touch electrodes, the touch link line 156 can be electrically connected to each of the first and second touch electrodes 152 and 154 without having a separate connection hole.

For example, the touch link line 156 is formed in a single layer or a plurality of layers structure using a first conductive layer having strong corrosion resistance and acid resistance and good conductivity, such as aluminum (Al), titanium (Ti), copper (Cu), or molybdenum (Mo). The touch link line 156 can be formed of a transparent conductive layer, such as indium tin oxide (ITO) or indium zinc oxide (IZO) having strong corrosion resistance and acid resistance.

In the meantime, after forming the above-described first and second touch electrodes 152 and 154, the touch link line 156, the second touch pad electrode 174, and the second display pad electrode 186, a touch barrier film can be further provided in an area excluding the pad unit, to protect the surfaces of the first and second touch electrodes 152 and 154 and the touch link line 156. The touch barrier film can be disposed so as to correspond to the CA area of FIGS. 7 and 8. The touch barrier film can suppress the light emitting diode from being damaged by the external moisture by reinforcing the function of not only the first and second touch electrodes 152 and 154 and the touch link line 156, but also the encapsulation layer 140. The touch barrier film can be formed by applying the inorganic insulating film on an organic insulating film. An optical film, such as circular polarizer or a luminance enhancing film, can also be disposed above the touch barrier film.

Figure 9:
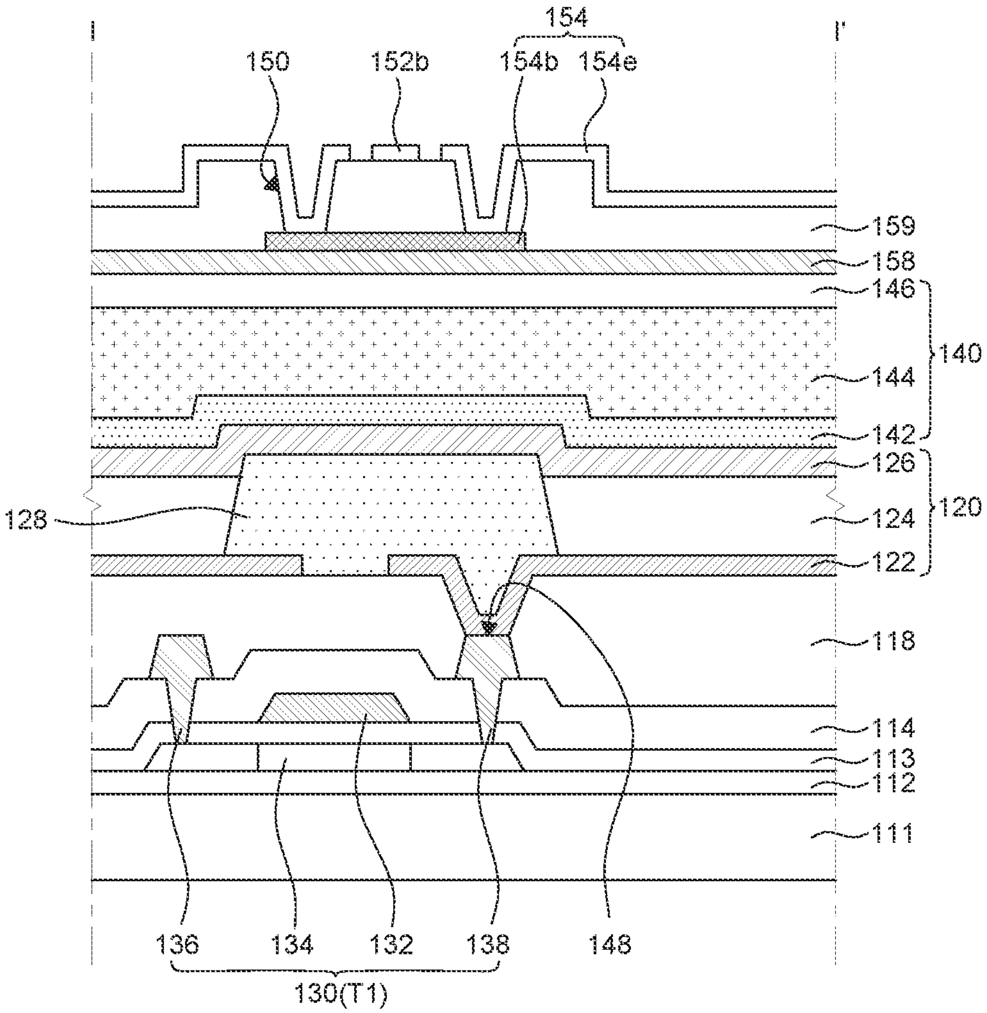
FIG. 9 is a cross-sectional view taken along the line I-I' of FIG. 8 according to an example of the present disclosure.

FIG. 9 is a cross-sectional view taken along the line I-I' of FIG. 8 according to an example of the present disclosure.

Figure 10:
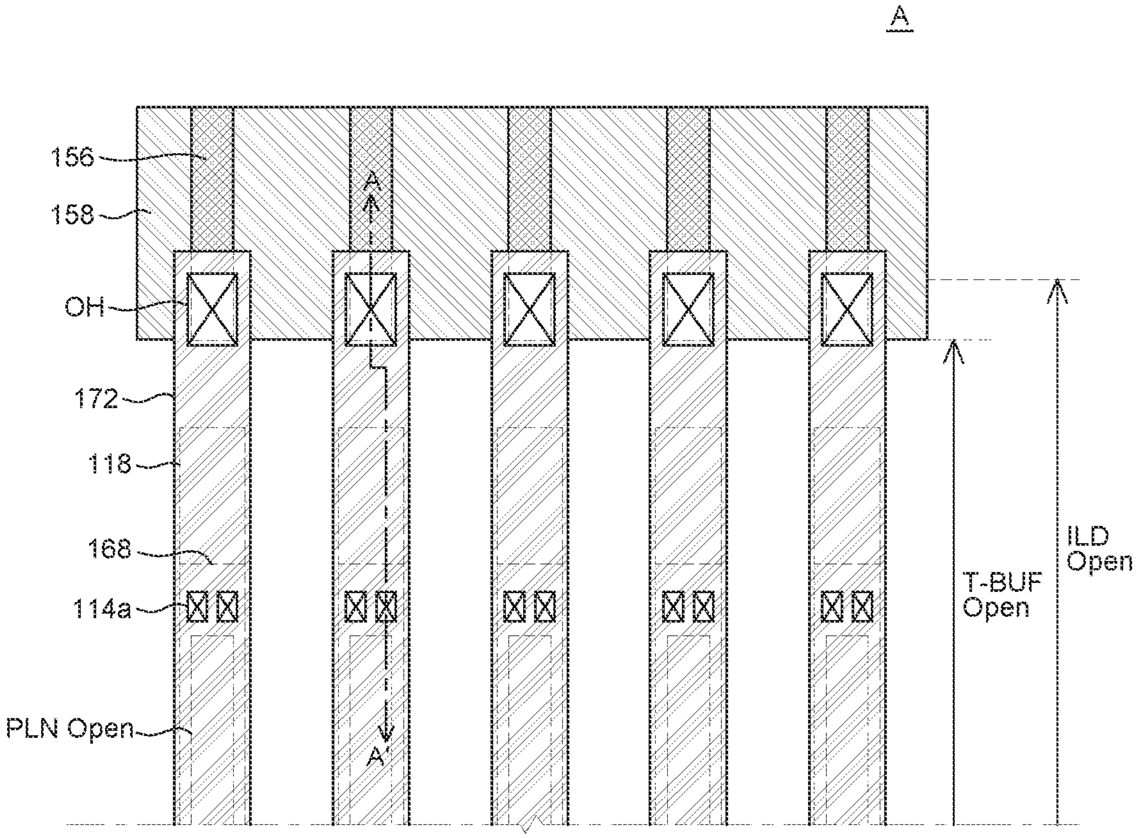
FIG. 10 is a view illustrating a part A of FIG. 8 according to an example of the present disclosure.

FIG. 10 is a view illustrating a part A of FIG. 8 according to an example of the present disclosure.

Figure 11:
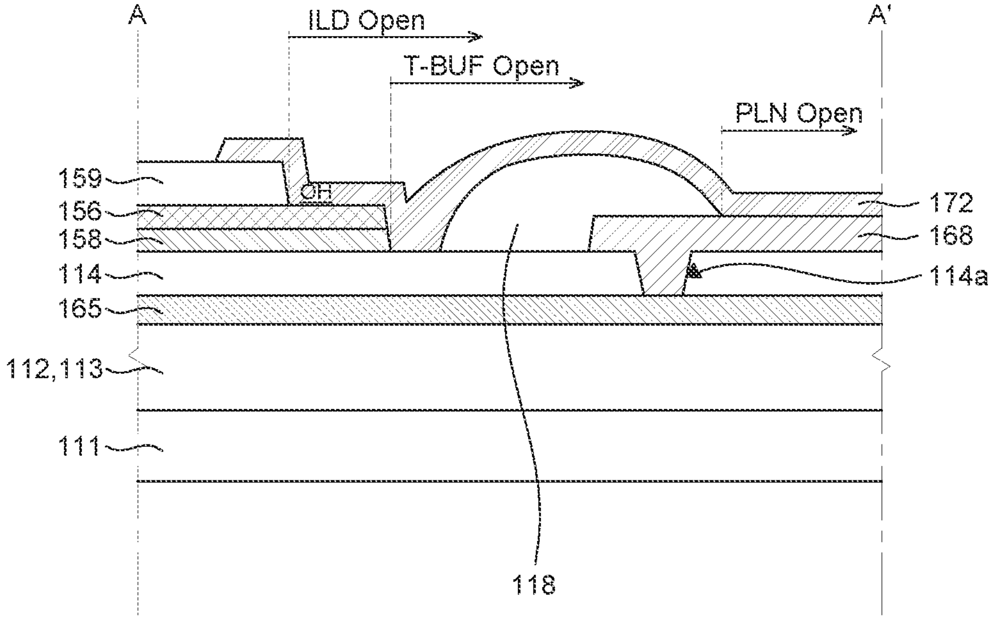
FIG. 11 is a cross-sectional view taken along the line A-A' of FIG. 10 according to an example of the present disclosure.

FIG. 11 is a cross-sectional view taken along the line A-A' of FIG. 10 according to an example of the present disclosure.

Figure 12:
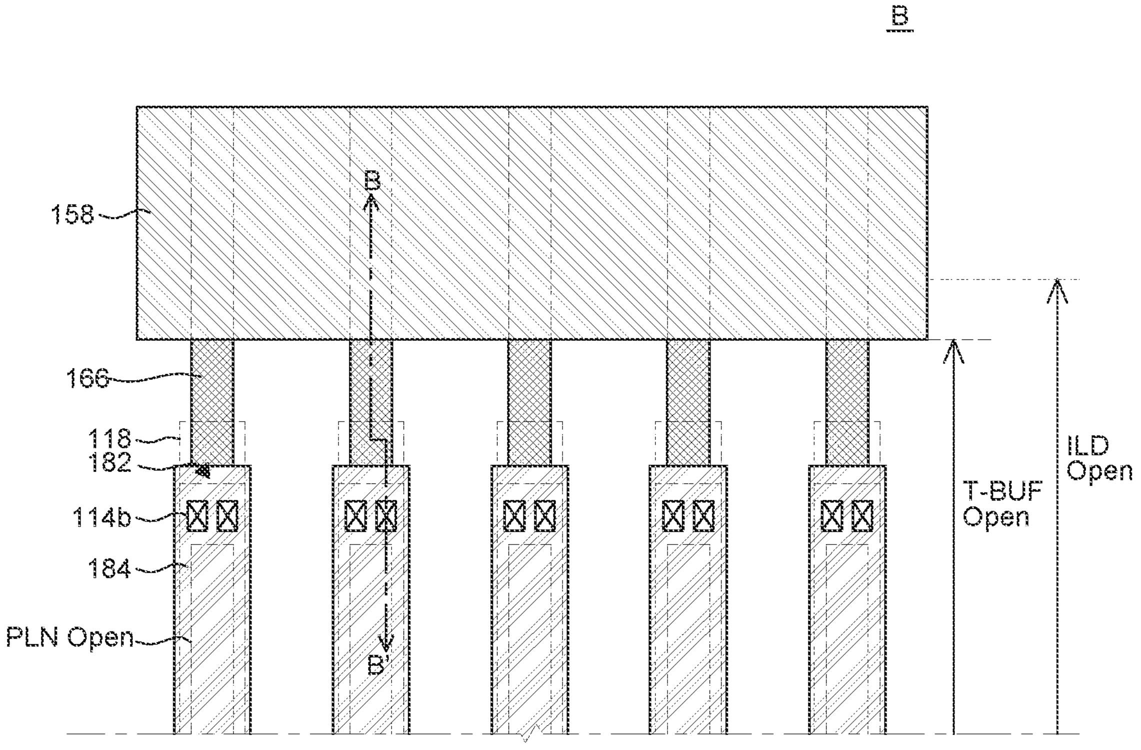
FIG. 12 is a view illustrating a part B of FIG. 8 according to an example of the present disclosure.

FIG. 12 is a view illustrating a part B of FIG. 8 according to an example of the present disclosure.

Figure 13:
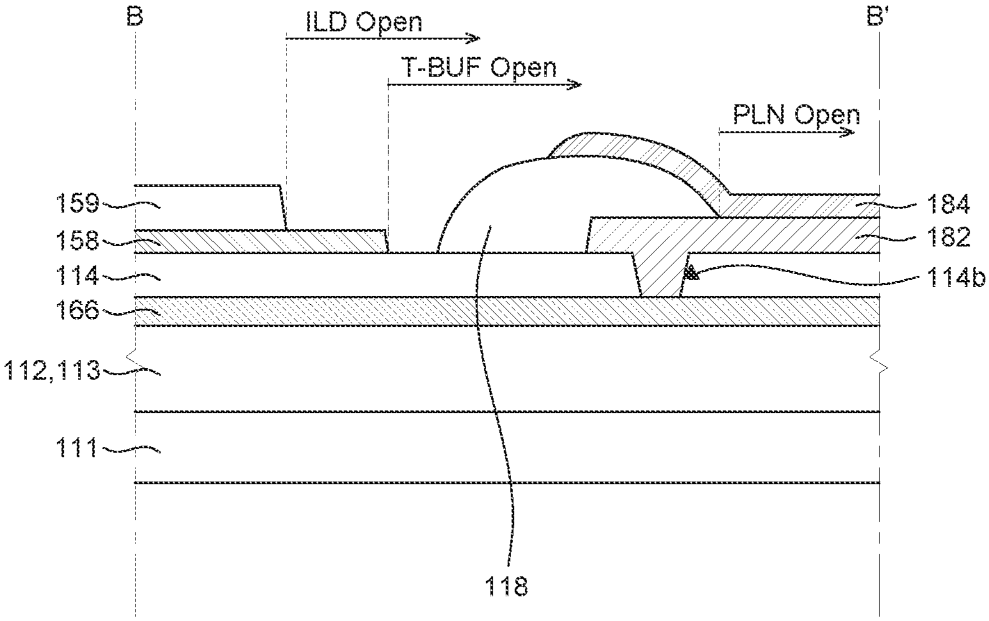
FIG. 13 is a cross-sectional view taken along the line B-B' of FIG. 12 according to an example of the present disclosure.

FIG. 13 is a cross-sectional view taken along the line B-B' of FIG. 12 according to an example of the present disclosure.

For example, FIG. 9 illustrates a part of a cross-sectional structure of an active area of the display apparatus according to the exemplary embodiment of the present disclosure and FIGS. 11 and 13 illustrate a part of a cross-sectional structure of a pad unit of the display apparatus according to the exemplary embodiment of the present disclosure.

For example, FIGS. 10 and 11 show a planar structure and a cross-sectional structure in which the touch pad is disposed in the display apparatus according to the exemplary embodiment of the present disclosure.

For example, FIGS. 10 and 11 show a planar structure and a cross-sectional structure in which the display pad is disposed in the display apparatus according to the exemplary embodiment of the present disclosure.

Referring to FIGS. 9 to 13, a buffer layer 112, such as a multi-buffer layer or a lower buffer layer, can be disposed on the substrate 111.

In an example, the flexible substrate 111 can use a ductile material having a flexible characteristic such as plastic.

The substrate 111 can be a film type including one of a group consisting of a polyester-based polymer, a silicon-based polymer, an acrylic polymer, a polyolefin-based polymer, and a copolymer thereof.

The substrate 111 can include a first substrate, a second substrate, and an insulating film. The insulating film can be disposed between the first substrate and the second substrate. As described above, the substrate 111 is configured by the first substrate, the second substrate, and the insulating film, to suppress the moisture permeation. For example, the first substrate and the second substrate can be polyimide (PI) substrates.

For example, the multi-buffer layer can delay the spreading of the moisture or oxygen permeating the substrate 111 and can be formed by alternately stacking silicon nitride (SiNx) and silicon oxide (SiOx) at least one time.

The lower buffer layer can serve a function of protecting the semiconductor layer 134 and blocking various types of defects entering from the substrate 111. For example, the lower buffer layer can be formed by amorphous silicon, silicon nitride (SiNx), or silicon oxide (SiOx).

The buffer layer 112 can extend to the pad unit of the substrate 111 in which the touch pad and the display pad are disposed.

The switching thin film transistor (T2 in the pixel driving circuit of FIG. 3) and the driving thin film transistor 130 (T1 in the pixel driving circuit of FIG. 3) can be disposed above the buffer layer 112.

Specifically, the semiconductor layer 134 can be disposed in the active area above the substrate 111.

For example, the semiconductor layer 134 can be formed of a polycrystalline semiconductor and can include a channel region, a source region, and a drain region. However, it is not limited thereto and the semiconductor layer 134 can also be configured by amorphous silicon or oxide semiconductor.

The polycrystalline semiconductor has a higher mobility than the amorphous semiconductor and the oxide semiconductor so that the power consumption is low and the reliability is excellent.

The gate insulating film 113 can be disposed on the semiconductor layer 134. The gate insulating film 113 can be configured by a single layer of silicon nitride (SiNx) or silicon oxide (SiOx) or a plurality of layers thereof. The gate insulating film 113 can be disposed to extend to the pad unit of the substrate 111.

A gate line is disposed on the gate insulating film 113 in a first direction, and a gate electrode 132 which is connected to the gate line or formed in an island shape can be disposed.

The gate electrode 132 can be disposed on the gate insulating film 113 so as to overlap the semiconductor layer 134.

For example, the gate electrode 132 and the gate line can be configured by a single layer or plurality of layers of copper (Cu), aluminum (Al), molybdenum (Mo), chrome (Cr), gold (Au), titanium (Ti), nickel (Ni), and neodymium (Nd) which are conductive metals or an alloy thereof, but is not limited thereto.

A first pad unit line 165 and a second pad unit line 166 can be disposed in the pad unit of the substrate 111. The first pad unit line 165 is connected to the first touch pad electrode 168 of the touch pad and does not extend to the active area.

The second pad unit line 166 is connected to the first display pad electrode 182 of the display pad and extends to the active area to be electrically connected to the data line.

For example, the first pad unit line 165 and the second pad unit line 166 can be disposed on the same layer as the gate electrode 132 and the gate line.

The first pad unit line 165 and the second pad unit line 166 can be configured by a single layer or plurality of layers of copper (Cu), aluminum (Al), molybdenum (Mo), chrome (Cr), gold (Au), titanium (Ti), nickel (Ni), and neodymium (Nd) which are conductive metals or an alloy thereof, but are not limited thereto.

An interlayer insulating film 114 can be disposed on the gate electrode 132 so as to cover the gate electrode 132. For example, the interlayer insulating film 114 can be configured by a single layer of silicon nitride (SiNx) or silicon oxide (SiOx) or a plurality of layers thereof. The interlayer insulating film 114 can be disposed to extend to the pad unit of the substrate 111.

At this time, a partial area of the interlayer insulating film 114 and the gate insulating film 113 is selectively removed to form a contact hole which exposes both ends of the semiconductor layer 134.

Further, a partial area of the interlayer insulating film 114 in the pad unit is selectively removed to form a first pad unit contact hole 114*a* and a second pad unit contact hole 114*b* which expose parts of a first pad unit line 165 and a second pad unit line 166.

The data line can be disposed on the interlayer insulating film 114 in a direction intersecting the gate line.

Further, a source electrode 136 and a drain electrode 138 which are connected to both ends of the semiconductor layer 134 can be disposed on the interlayer insulating film 114.

The first touch pad electrode 168 and the first display pad electrode 182 can be disposed in a non-active area corresponding to one side of the substrate 111, for example, in the pad unit.

The first touch pad electrode 168 is disposed on the interlayer insulating film 114 of the pad unit to be connected to the first pad unit line 165 through the first pad unit contact hole 114*a*.

The first display pad electrode 182 is disposed on the interlayer insulating film 114 of the pad unit to be connected to the second pad unit line 166 through the second pad unit contact hole 114*b*.

Further, the display link line (137 of FIG. 7) extending from the data line and/or the gate line can be disposed in the non-active area corresponding to one side and/or the other side of the substrate 111.

When the display link line 137 is configured by extending from the gate line, the first display pad electrode 182 and the display link line 137 can be located on the same layer as the gate electrode 132 and can be connected to each other without a jumping structure.

In the meantime, when the display link line 137 is configured by extending from the data line, the first display pad electrode 182 and the display link line 137 can be located on the different layers from each other and can be connected to each other through a jumping structure.

A protective film can be disposed on the data line and the source electrode 136 and the drain electrode 138. The protective film can be omitted as needed.

The protective film can be formed as a single layer of silicon nitride (SiNx) or silicon oxide (SiOx) or a plurality of layers thereof.

A planarization film 118 can be disposed on the protective film. The planarization film 118 can be configured with one or more materials of acrylic resin, epoxy resin, phenolic resin, polyamides resin, polyimides resin, unsaturated polyesters resin, polyphenylene resin, benzocyclobutene, and polyphenylenesulfides resin, but is not limited thereto.

In the meantime, the planarization film 118 is removed from a part of the non-active area so that the lifting of the planarization film 118 caused during a bonding or repair process on the pad unit, can be suppressed.

For example, the planarization film 118 can be patterned in the pad unit in an island shape so as to overlap a part of the first touch pad electrode 168 and the first display pad electrode 182 of the pad unit. For example, the planarization film 118 is formed to have a similar shape to the first connection pad electrode 172 and the second connection pad electrode 184 of the pad unit to be disposed between the first connection pad electrode 172 and the first touch pad electrode 168 and between the second connection pad electrode 184 and the first display pad electrode 182.

Further, the planarization film 118 can be patterned to be spaced apart from one end of the touch buffer film 158 with a predetermined interval, but is not limited thereto.

Further, the planarization film 118 can be patterned to include an open area PLN Open which exposes a part between the first connection pad electrode 172 and the first touch pad electrode 168 and between the second connection pad electrode 184 and the first display pad electrode 182. FIGS. 10 and 12 illustrate that the open area PLN Open of the planarization film 118 exposes a part of the center of the first touch pad electrode 168 and the first display pad electrode 182 to be electrically connected to each of the first connection pad electrode 172 and the second connection pad electrode 184 through the open area PLN Open. However, it is not limited thereto.

At this time, the planarization film 118 is selectively removed to form a pixel connection hole 148 which exposes the drain electrode 138 of the driving thin film transistor 130 and during this process, the planarization film 118 of the pad unit can also be removed. At this time, in the pad unit, the open area PLN Open can be formed.

A connection electrode which is connected to the drain electrode 138 of the driving thin film transistor 130 through the pixel connection hole 148 can also be disposed on the planarization film 118. For example, the connection electrode can be configured with a material, such as copper (Cu), aluminum (Al), molybdenum (Mo), chrome (Cr), gold (Au), titanium (Ti), nickel (Ni), and neodymium (Nd), or an alloy thereof.

When the connection electrode is disposed, the second planarization film can be disposed on the connection electrode. For example, the second planarization film can be configured with one or more materials of acrylic resin, epoxy resin, phenolic resin, polyamides resin, polyimides resin, unsaturated polyesters resin, polyphenylene resin, benzocyclobutene, and polyphenylene sulfides resin, but is not limited thereto.

The second planarization film can include a contact hole which exposes the connection electrode.

A light emitting diode 120 which is electrically connected to the connection electrode through a contact hole can be disposed above the second planarization film.

When the connection electrode and the second planarization film are not disposed, the light emitting diode 120 which is connected to the drain electrode 138 through the pixel connection hole 148 can be disposed above the planarization film 118.

At this time, for example, the light emitting diode 120 can include an anode 122 connected to the drain electrode 138 of the driving thin film transistor 130, at least one emission stack 124 disposed on the anode 122, and a cathode 126 disposed on the emission stack 124.

The emission stack 124 can include a hole injection layer, a hole transport layer, an emission layer, an electron transport layer, and an electron injection layer. In a tandem structure in which a plurality of emission layers is overlaid, a charge generation layer can be further disposed between the emission layers. The emission layer can emit different color light in every sub pixel. For example, a red emission layer, a green emission layer, and a blue emission layer can be separately disposed in every sub pixel. However, a common emission layer is formed in every sub pixel to emit white light regardless of the color and a color filter which distinguishes the color can be separately provided. The emission layer can be individually disposed, but the hole injection layer, the electron injection layer, the hole transport layer, or the electron transport layer is provided as a common layer to be disposed in each sub pixel in the same way.

At this time, the anode 122 can be electrically connected to the drain electrode 138 exposed through the pixel connection hole 148. The anode 122 can be configured to have a plurality of layers structure including a transparent conductive film and an opaque conductive film having high reflection efficiency. The transparent conductive film is configured with a material having a relatively high work function, such as indium-tin-oxide (ITO) or indium-zinc-oxide (IZO) and the opaque conductive film can be configured as a single or plurality of layers structure including Al, Ag, Cu, Pb, Mo, Ti, or an alloy thereof. For example, the anode 122 is configured by a structure in which a transparent conductive film, an opaque conductive film, and a transparent conductive film are sequentially laminated or can be configured by a structure in which a transparent conductive film and an opaque conductive film are sequentially laminated.

The anode 122 is disposed not only in the emission area provided by the bank 128, but also above the planarization film 118 so as to overlap the pixel circuit area in which the driving thin film transistor 130 and the storage capacitor are disposed so that the emission area can be increased.

The emission stack 124 can also be configured by laminating the hole transport layer, the emission layer, and the electron transport layer in this order or a reverse order, on the anode 122. In addition, the emission stack 124 can include first and second emission stacks which are opposite to each other with the charge generating layer therebetween.

The bank 128 can be provided to expose the anode 122. The bank 128 can be configured with an organic material, such as photo acryl, or a translucent material, but is not limited thereto and also can be configured with an opaque material to suppress the optical interference between sub pixels.

The cathode 126 can be disposed on the emission stack 124 to be opposite to the anode 122 with the emission stack 124 therebetween. When the cathode 126 is applied to a top emission type light emitting display panel, the cathode can be configured by a transparent conductive film obtained by forming indium tin oxide (ITO), indium zinc oxide (IZO), or magnesium-silver (Mg-AG) to be thin.

An encapsulation layer 140 can be disposed above the cathode 126 to protect the light emitting diode 120. The light emitting diode 120 can react to external moisture and oxygen due to a characteristic of the organic material of the emission stack 124 to cause dark-spot or pixel shrinkage. In order to suppress this problem, the encapsulation layer 140 can be disposed above the cathode 126. The encapsulation layer 140 can be configured by a first inorganic insulating film 142, a foreign material compensation layer 144, and a second inorganic insulating film 146.

For example, the encapsulation layer 140 covers the entire active area AA so as to sufficiently cover the light emitting diode 120 therebelow and extends to a non-active area excluding the pad unit to cover the display link line 137 formed earlier (see FIG. 8).

The first inorganic insulating film 142 can be disposed above the substrate 111 in which the cathode 126 is disposed to be the most adjacent to the light emitting diode 120. The first inorganic insulating film 142 can be formed of an inorganic insulating material on which low-temperature deposition is allowed, such as silicon nitride (SiNx), silicon oxide (SiOx), silicon oxynitride (SiON), or aluminum oxide ($Al_2O_3$). The first inorganic insulating film 142 is deposited under a low temperature environment so that the damage of the emission stack 124 including an organic material vulnerable to the high temperature atmosphere during the deposition can be suppressed.

The foreign material compensation layer 144 can be disposed to have a smaller area than the first inorganic insulating film 142 and can be configured to expose both ends of the first inorganic insulating film 142. The foreign material compensation layer 144 serves as a buffer for alleviating a stress between layers caused when the light emitting display apparatus is bent and can enhance a planarization performance. The foreign material compensation layer 144 can be formed of an organic insulating material, such as acrylic resin, epoxy resin, polyimide, polyethylene, or silicon oxy carbon (SiOC).

In the meantime, when the foreign material compensation layer 144 is formed by an inkjet method, one or more dams can be disposed in a boundary area of the non-active area and the active area or a dam area corresponding to a partial area in the non-active area can be disposed. In such a dam area, a primary dam adjacent to the active area and a secondary dam adjacent to the pad unit can be disposed.

When a liquid type foreign material compensation layer 144 is dropped in the active area, one or more dams disposed in the dam area can suppress the liquid type foreign material compensation layer 144 from collapsing in the direction of the non-active area to invade the pad unit.

The primary dam and/or secondary dam can be configured as a single layer or a plurality of layers structure. For example, the primary dam and/or secondary dam can be simultaneously configured with the same material as at least one of the bank 128 and the spacer. In this case, the dam structure can be configured without having the mask adding process and increasing the cost.

Further, the foreign material compensation layer 144 including an organic layer can be located only on an inner surface of the primary dam.

Further, the second inorganic insulating film 146 can be disposed so as to cover an upper surface and a side surface of each of the first inorganic insulating film 142 and the foreign material compensation layer 144. The second inorganic insulating film 146 can serve to minimize or block the permeation of the external moisture or oxygen into the first inorganic insulating film 142 and the foreign material compensation layer 144. The second inorganic insulating film 146 can be formed of an inorganic insulating material, such as silicon nitride (SiNx), silicon oxide (SiOx), silicon oxynitride (SiON), or aluminum oxide ($Al_2O_3$).

A touch buffer film 158 can be disposed on the encapsulation layer 140. The touch buffer film 158 can be disposed between the first touch electrode 152 and the second touch electrode 154 and the touch link line 156 and the encapsulation layer 140.

The touch buffer film 158 can be designed to maintain a predetermined minimum distance (for example, 1 μm) between the first touch electrode 152 and the second touch electrode 154 and the cathode 126 of the light emitting diode 120. Therefore, a parasitic capacitance formed between the first touch electrode 152 and the second touch electrode 154 and the cathode 126 of the light emitting diode 120 is reduced or suppressed and by doing this, the degradation of the touch sensitivity by the parasitic capacitance can be suppressed.

The first touch electrode 152 and the second touch electrode 154 and the touch link line 156 can also be disposed on the encapsulation layer 140 without the touch buffer film 158.

In the pad unit, the touch buffer film 158 is removed to be open and form an open area T-BUF Open.

The touch buffer film 158 can be patterned to be spaced apart from one end of the planarization film 118 which is disposed in the pad unit as an island shape or to be in contact therewith, but is not limited thereto.

For example, a second bridge **154*b* with a single layer or a plurality of layers structure formed of a metal having a strong corrosion resistance and acid resistance, such as aluminum (Al), titanium (Ti), copper (Cu), or molybdenum (Mo), can be disposed on the touch buffer film 158** with an island shape.

Further, the touch link line 156 is disposed on the touch buffer film 158 and the touch link line 156 can extend to the touch pad unit located at the outside of the encapsulation layer 140. For example, the touch link line 156 can extend toward the touch pad unit so as to be coincided with one end of the touch buffer film 158, but is not limited thereto. The touch link line 156 may not be in contact with the planarization film 118 disposed in the pad unit with an island shape.

The touch link line 156 is formed together when the first and second touch electrodes 152 and 154 are formed and can be located on the same layer as the second bridge **154*b***.

For example, the touch link line 156 and the second bridge **154*b*** can be configured as a single layer or a plurality of layers structure using a metal having a strong corrosion resistance and acid resistance, such as aluminum (Al), titanium (Ti), copper (Cu), or molybdenum (Mo).

Further, the touch insulating film 159 can be disposed on the touch link line 156 and the second bridge **154*b***.

For example, the touch insulating film 159 can use an organic film or an inorganic film which can be formed by a low temperature process. When the organic film is used for the touch insulating film 159, after coating the organic film above the substrate 111, the organic film is cured at a temperature of 100° C. or lower to form the touch insulating film 159 to suppress the damage of the emission stack 124 vulnerable to the high temperature. When the inorganic film is used for the touch insulating film 159, in order to suppress the damage of the emission stack 124 vulnerable to the high temperature, a low temperature CVD deposition process and a cleaning process are repeated at least two times to form the touch insulating film 159 with a plurality of layers structure.

In the active area, a partial area of the touch insulating film 159 is selectively removed to form a touch connection hole 150 so as to expose a top surface of both ends of the second bridge **154*b***.

In the pad unit, the touch insulating film 159 is removed to be open and form an open area ILD Open.

The touch insulating film 159 can be patterned to be spaced apart from one end of the planarization film 118 which is disposed in the pad unit as an island shape with a predetermined distance, but is not limited thereto.

The touch insulating film 159 can be patterned to be spaced apart from one ends of the touch link line 156 and the touch buffer film 158 with a predetermined distance, but is not limited thereto.

The open area ILD Open of the touch insulating film 159 can be larger than an open area T-BUF Open of the touch buffer film 158 so that an open hole OH which exposes a part of the top surface of the touch link line 156 can be formed.

In the active area, on the touch insulating film 159, the second touch pattern 154*e* which is connected to the second bridge 154*b* through the touch connection hole 150, the first touch pattern (152*e* of FIG. 8), and the first bridge 152*b* can be disposed. The first touch pattern is spaced apart from the second touch pattern 154*e* to be disposed in a direction intersecting the second touch pattern 154*e* and the first bridge 152*b* connects the adjacent first touch patterns 152*e* to each other.

In the pad unit, the first connection pad electrode 172 and the second connection pad electrode 184 can be disposed on the planarization film 118.

One end of the first connection pad electrode 172 extends toward the active area to be connected to the touch link line 156 through an open hole OH. For example, one end of the first connection pad electrode 172 can extend to a part of the top surface of the touch insulating film 159.

The other end of the first connection pad electrode 172 extends toward the pad unit to be connected to the first touch pad electrode 168 exposed through the open area PLN Open.

In the meantime, the second connection pad electrode 184 is patterned so as to cover only a part of the planarization film 118 and one end thereof extends toward the pad unit to be connected to the first display pad electrode 182 exposed through the open area PLN Open.

As described above, in the present disclosure, in the pad unit in which the touch pad is bonded in a COF manner, the touch buffer film 158 and the touch insulating film 159 are partially removed to expose a part of the touch link line 156 and the first connection pad electrode 172 can be disposed thereon. Therefore, the moisture permeation path is blocked to suppress efficiently and address the electrolytic corrosion defect/issue of the COF associated with the film lifting.

For example, in the pad unit in which the touch pad is bonded in a COF manner, in the related art, the touch buffer film and the touch insulating film of the touch pad are disposed on the entire planarization film which covers the first touch pad electrode so that a film stress on the planarization film is increased, which causes the film lifting. That is, the film is lifted in the related art due to the increased film stress caused by the increased $NH_3$ concentration and in this case, when the moisture permeates into the lifted film under the high temperature and high humidity environment, the electrolytic corrosion of the COF is caused and occurs. Further, in the related art, when the planarization film in which the film is lifted is removed, the dark-spot can also be caused by the aluminum arcing (Al arcing) on the first touch pad electrode.

To address these issues of the related art, in the present disclosure, in order to suppress the lifting of the planarization film 118 which can cause an electrolytic corrosion of COF, for example, the touch buffer film 158 and the touch insulating film 159 are partially removed to expose a part of the touch link line 156 and the first connection pad electrode 172 can be disposed thereon.

In some aspects of the present disclosure, the first touch pad electrode which is connected to the first connection pad electrode 172 and the second display pad electrode which is connected to the second connection pad electrode 184 can be disposed above the first connection pad electrode 172 and the second connection pad electrode 184. However, it is not limited thereto and as needed, the second touch pad electrode and the second display pad electrode can be omitted.

In some aspects of the present disclosure, the second touch pad electrode and the second display pad electrode can use a transparent conductive layer, such as indium tin oxide (ITO) or indium zinc oxide (IZO), or a metal having strong corrosion resistance and acid resistance, such as aluminum (Al), titanium (Ti), copper (Cu), or molybdenum (Mo) or two or more laminated layers thereof. In this case, in order to achieve the stability by suppressing the corrosion of the surfaces of the second touch pad electrode and the second display pad electrode which are the uppermost electrodes forming the touch pad and the display pad, a single layer of a transparent conductive film, such as indium tin oxide (ITO) or indium zinc oxide (IZO) can be used. Further, in the case of a plurality of layers, the plurality of layers can be configured by a transparent conductive film, such as indium tin oxide (ITO) or indium zinc oxide (IZO).

The exemplary embodiments of the present disclosure can also be described as follows:

According to an aspect of the present disclosure, there is provided a display apparatus. The display apparatus includes a substrate including an active area and a non-active area including a pad unit, a plurality of thin film transistors disposed in the active area, a light emitting diode which is disposed in the active area and is connected to the thin film transistor, an encapsulation layer which covers the thin film transistor and the light emitting diode; a touch electrode array disposed in the active area above the encapsulation layer, a first touch pad electrode which is disposed in the pad unit of the substrate and is connected to the touch electrode array through a touch link line and a planarization film which is patterned in the pad unit in an island shape to cover a part of the first touch pad electrode.

The display apparatus can further include a first pad unit line and a second pad unit line disposed in the pad unit of the substrate, wherein the first pad unit line and the second pad unit line can be disposed on the same layer as a gate electrode of the thin film transistor and a gate line.

The first pad unit line can be connected to the first touch pad electrode and does not extend to the active area, and the second pad unit line can be connected to a first display pad electrode of the pad unit and extends to the active area to be electrically connected to a data line.

The display apparatus can further include an interlayer insulating film disposed on the gate electrode, wherein the interlayer insulating film can be disposed to extend to the pad unit of the substrate.

A partial area of the interlayer insulating film in the pad unit can be selectively removed to form a first pad unit contact hole and a second pad unit contact hole which expose parts of the first pad unit line and the second pad unit line.

The display apparatus can further include a first display pad electrode which can be disposed on the same layer as the first touch pad electrode in the pad unit, wherein the first touch pad electrode can be disposed on the interlayer insulating film in the pad unit to be connected to the first pad unit line through the first pad unit contact hole and the first display pad electrode can be disposed on the interlayer insulating film in the pad unit to be connected to the second pad unit line through the second pad unit contact hole.

The planarization film can be patterned in the pad unit in an island shape to cover a part of the first display pad electrode.

The planarization film can be patterned to include an open area which exposes the other parts of the first touch pad electrode and the first display pad electrode.

The display apparatus can further include a touch buffer film disposed above the encapsulation layer, wherein the touch electrode array can be configured by a plurality of first touch electrodes and a plurality of second touch electrodes intersecting each other, and the touch buffer film can be located between the first touch electrode and the second touch electrode and the touch link line and the encapsulation layer.

The touch buffer film can be removed from the pad unit to be spaced apart from one end of the planarization film patterned in the pad unit in an island shape, to be open.

The touch link line can be disposed on the touch buffer film and the touch link line extends toward the pad unit such that a side surface thereof coincides with one end of the touch buffer film, and the touch link line can be spaced apart from the planarization film which can be patterned in the pad unit in an island shape.

The display apparatus can further include a touch insulting film disposed on the touch link line, wherein the touch insulating film can be removed from the pad unit to be spaced apart from one end of the planarization film which can be patterned in the pad unit in an island shape with a predetermined distance, to be open, and the touch insulting film can be spaced apart from one ends of the touch link line and the touch buffer film with a predetermined distance.

An area in which the touch insulating film can be open can be larger than an area in which the touch buffer film can be open so that an open hole which can expose a part of a top surface of the touch link line can be exposed can be formed.

The display apparatus can further include a first connection pad electrode and a second connection pad electrode disposed on the planarization film in the pad unit, wherein an end of the first connection pad electrode can extend toward the active area to be connected to the touch link line through the open hole, and the other end of the first connection pad electrode can extend toward the pad unit to be connected to the first touch pad electrode exposed through the open area.

The second connection pad electrode can be patterned so as to cover only a part of the planarization film, and one end thereof can extend toward the pad unit to be connected to the first display pad electrode exposed through the open area.

The display apparatus can further include a second touch pad electrode and a second display pad electrode which are disposed above the first connection pad electrode and the second connection pad electrode, wherein the second touch pad electrode can be connected to the first connection pad electrode, and the second display pad electrode can be connected to the second connection pad electrode.

The encapsulation layer can cover the entire active area and extends to the non-active area excluding the pad unit to cover a display link line.

The display apparatus can further include a first connection pad electrode disposed on the planarization film in the pad unit, wherein an end of the first connection pad electrode can extend toward the active area to cover the side surface of the touch link line that coincides with one end of the touch buffer film and cover a part of a top surface of the touch link line, and the other end of the first connection pad electrode can extend toward the pad unit to be connected to the first touch pad electrode.

The end of the first connection pad electrode can extend to a part of the top surface of the touch insulating film.

According to another aspect of the present disclosure, there is provided a display apparatus. The display apparatus includes a substrate including an active area and a non-active area including a pad unit, a plurality of thin film transistors disposed in the active area, a light emitting diode which is disposed in the active area and is connected to the thin film transistor, an encapsulation layer which covers the thin film transistor and the light emitting diode, a touch electrode array disposed in the active area above the encapsulation layer, a touch pad electrode which is disposed in the pad unit of the substrate and is connected to the touch electrode array, a planarization film which is patterned in the pad unit in an island shape to cover a part of the touch pad electrode, a touch buffer film which is disposed above the encapsulation layer and is removed from the pad unit to be spaced apart from one end of the planarization film patterned in the pad unit in an island shape, to be open and a touch insulating film which can be disposed on a touch link line and can be removed from the pad unit to be spaced apart from one end of the planarization film patterned in the pad unit in an island shape with a predetermined distance, to be open.

Although the exemplary embodiments of the present disclosure have been described in detail with reference to the accompanying drawings, the present disclosure is not limited thereto and can be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display apparatus, comprising:
- a substrate including an active area and a non-active area having a pad unit;
- a thin film transistor disposed in the active area;
- a light emitting diode disposed in the active area and connected to the thin film transistor;
- an encapsulation layer covering the thin film transistor and the light emitting diode;
- a touch electrode array disposed in the active area on the encapsulation layer;
- a first touch pad electrode disposed in the pad unit of the substrate and connected to the touch electrode array through a touch link line; and
- a planarization film which is patterned in the pad unit in an island shape to cover a part of the first touch pad electrode.

2. The display apparatus according to claim 1, further comprising:
- a first pad unit line and a second pad unit line disposed in the pad unit of the substrate,
- wherein the first pad unit line and the second pad unit line are disposed on a same layer as a gate electrode of the thin film transistor and a gate line.

3. The display apparatus according to claim 2, wherein the first pad unit line is connected to the first touch pad electrode and does not extend to the active area, and
- the second pad unit line is connected to a first display pad electrode of the pad unit and extends to the active area to be electrically connected to a data line.

4. The display apparatus according to claim 2, further comprising:
- an interlayer insulating film disposed on the gate electrode,
- wherein the interlayer insulating film is disposed to extend to the pad unit of the substrate.

5. The display apparatus according to claim 4, wherein a partial area of the interlayer insulating film in the pad unit is selectively removed, so to form a first pad unit contact hole and a second pad unit contact hole which expose parts of the first pad unit line and the second pad unit line.

6. The display apparatus according to claim 5, further comprising:

a first display pad electrode disposed on a same layer as the first touch pad electrode in the pad unit, wherein the first touch pad electrode is disposed on the interlayer insulating film in the pad unit to be connected to the first pad unit line through the first pad unit contact hole, and the first display pad electrode is disposed on the interlayer insulating film in the pad unit to be connected to the second pad unit line through the second pad unit contact hole.

7. The display apparatus according to claim 6, wherein the planarization film is patterned in the pad unit in an island shape to cover a part of the first display pad electrode.

8. The display apparatus according to claim 7, wherein the planarization film is patterned to include an open area which exposes other parts of the first touch pad electrode and the first display pad electrode.

9. The display apparatus according to claim 8, further comprising:

a touch buffer film disposed on the encapsulation layer, wherein the touch electrode array is configured by a plurality of first touch electrodes and a plurality of second touch electrodes intersecting each other, and the touch buffer film is located between the first touch electrode and the second touch electrode and the touch link line and the encapsulation layer.

10. The display apparatus according to claim 9, wherein the touch buffer film is removed from the pad unit to be spaced apart from one end of the planarization film patterned in the pad unit in an island shape, so as to be open.

11. The display apparatus according to claim 9, wherein the touch link line is disposed on the touch buffer film and the touch link line extends toward the pad unit so that a side surface thereof coincides with one end of the touch buffer film, and the touch link line is spaced apart from the planarization film which is patterned in the pad unit in an island shape.

12. The display apparatus according to claim 10, further comprising:

a touch insulting film disposed on the touch link line, wherein the touch insulating film is removed from the pad unit to be spaced apart from one end of the planarization film which is patterned in the pad unit in an island shape with a predetermined distance, so as to be open, and the touch insulting film is spaced apart from one ends of the touch link line and the touch buffer film with a predetermined distance.

13. The display apparatus according to claim 12, wherein an area in which the touch insulating film is open is larger than an area in which the touch buffer film is open, so that an open hole which exposes a part of a top surface of the touch link line is exposed is formed.

14. The display apparatus according to claim 13, further comprising:

a first connection pad electrode and a second connection pad electrode disposed on the planarization film in the pad unit, wherein an end of the first connection pad electrode extends toward the active area to be connected to the touch link line through the open hole, and another end of the first connection pad electrode extends toward the pad unit to be connected to the first touch pad electrode exposed through the open area.

15. The display apparatus according to claim 14, wherein the second connection pad electrode is patterned so as to cover only a part of the planarization film, and one end thereof extends toward the pad unit to be connected to the first display pad electrode exposed through the open area.

16. The display apparatus according to claim 14, further comprising:

a second touch pad electrode and a second display pad electrode disposed on the first connection pad electrode and the second connection pad electrode, wherein the second touch pad electrode is connected to the first connection pad electrode, and the second display pad electrode is connected to the second connection pad electrode.

17. The display apparatus according to claim 14, wherein the end of the first connection pad electrode extends to a part of the top surface of the touch insulating film.

18. The display apparatus according to claim 11, further comprising:

a first connection pad electrode disposed on the planarization film in the pad unit, wherein an end of the first connection pad electrode extends toward the active area to cover a side surface of the touch link line that coincides with one end of the touch buffer film and to cover a part of a top surface of the touch link line, and another end of the first connection pad electrode extends toward the pad unit to be connected to the first touch pad electrode.

19. The display apparatus according to claim 1, wherein the encapsulation layer covers the entire active area and extends to the non-active area excluding the pad unit to cover a display link line.

20. A display apparatus, comprising:

a substrate including an active area and a non-active area having a pad unit;

a thin film transistor disposed in the active area;

a light emitting diode disposed in the active area and connected to the thin film transistor;

an encapsulation layer covering the thin film transistor and the light emitting diode;

a touch electrode array disposed in the active area on the encapsulation layer;

a touch pad electrode disposed in the pad unit of the substrate and connected to the touch electrode array;

a planarization film patterned in the pad unit in an island shape to cover a part of the touch pad electrode;

a touch buffer film disposed on the encapsulation layer and removed from the pad unit to be spaced apart from one end of the planarization film patterned in the pad unit in an island shape, so as to be open; and a touch insulating film disposed on a touch link line and removed from the pad unit to be spaced apart from one end of the planarization film patterned in the pad unit in an island shape with a predetermined distance, so as to be open.

* * * * *